US012685163B2

(12) United States Patent
Yamamoto et al.

(10) Patent No.: US 12,685,163 B2
(45) Date of Patent: Jul. 14, 2026

(54) SEMICONDUCTOR DEVICE

(71) Applicant: Mitsubishi Electric Corporation, Tokyo (JP)

(72) Inventors: Tadatsugu Yamamoto, Fukuoka (JP); Ryoji Murai, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 580 days.

(21) Appl. No.: 17/997,120

(22) PCT Filed: Jul. 21, 2020

(86) PCT No.: PCT/JP2020/028186
§ 371 (c)(1),
(2) Date: Oct. 25, 2022

(87) PCT Pub. No.: WO2022/018817
PCT Pub. Date: Jan. 27, 2022

(65) Prior Publication Data
US 2023/0178454 A1      Jun. 8, 2023

(51) Int. Cl.
*H10W 40/47* (2026.01)
*H10W 40/25* (2026.01)
(Continued)

(52) U.S. Cl.
CPC ......... *H10W 40/47* (2026.01); *H10W 40/255* (2026.01); *H10W 70/421* (2026.01);
(Continued)

(58) Field of Classification Search
CPC ............. H01L 23/473; H01L 23/49541; H01L 23/3121; H01L 23/46; H01L 23/043;
(Continued)

(56) References Cited

U.S. PATENT DOCUMENTS

2013/0154084 A1      6/2013   Kadoguchi et al.
2016/0343641 A1*    11/2016   Hori ........................ H01L 24/49
                                    (Continued)

FOREIGN PATENT DOCUMENTS

CN          103081097 A      5/2013
CN          106134305 A     11/2016
                   (Continued)

OTHER PUBLICATIONS

An Office Action; "Notice of Reasons for Refusal," mailed by the Japanese Patent Office on Feb. 7, 2023, which corresponds to Japanese Patent Application No. 2022-538522 and is related to U.S. Appl. No. 17/997,120; with English language translation.
(Continued)

*Primary Examiner* — Dale E Page
*Assistant Examiner* — Genevieve G Bullard-Connor
(74) *Attorney, Agent, or Firm* — Studebaker Brackett PLLC

(57) ABSTRACT

Heat from a semiconductor device is effectively dissipated while the height of the semiconductor device is kept low. A semiconductor device includes a cooler configured to cool a semiconductor module. The semiconductor module includes: a metal block, a semiconductor element, a terminal connected to the semiconductor element, and a resin covering a part of the terminal, the metal block, and the semiconductor element. The cooler includes: a metal base including the semiconductor module in a plan view while being in contact with a lower surface of the semiconductor module, and a cooling pipe disposed on an upper surface of the metal base and configured to cool the semiconductor module. The cooling pipe at least partially surrounds the semiconductor module in a plan view.

20 Claims, 18 Drawing Sheets

(51) Int. Cl.

| | |
|---|---|
| *H10W 70/40* | (2026.01) |
| *H10W 72/00* | (2026.01) |
| *H10W 72/30* | (2026.01) |
| *H10W 72/90* | (2026.01) |
| *H10W 74/10* | (2026.01) |
| *H10W 72/50* | (2026.01) |
| *H10W 90/00* | (2026.01) |

(52) U.S. Cl.
CPC ........ *H10W 72/952* (2026.01); *H10W 74/114* (2026.01); *H10W 72/07354* (2026.01); *H10W 72/075* (2026.01); *H10W 72/347* (2026.01); *H10W 72/5524* (2026.01); *H10W 72/851* (2026.01); *H10W 72/865* (2026.01); *H10W 72/884* (2026.01); *H10W 74/111* (2026.01); *H10W 90/736* (2026.01); *H10W 90/755* (2026.01)

(58) Field of Classification Search
CPC . H01L 2224/32245; H01L 2224/32225; H01L 24/32; H01L 24/33; H01L 24/45; H01L 24/48; H01L 24/73; H01L 24/83; H01L 24/85; H01L 2224/85447; H01L 2224/83447; H01L 2224/73265; H01L 2224/73215; H01L 2224/48175; H01L 2224/45124; H01L 2224/33181; H01L 23/3735; H10W 40/255; H10W 40/47; H10W 70/421; H10W 72/07354; H10W 72/075; H10W 72/347; H10W 72/5524; H10W 72/851; H10W 72/865; H10W 72/884; H10W 72/952; H10W 74/111; H10W 74/114; H10W 90/736; H10W 90/755; H02G 3/0481
See application file for complete search history.

(56) References Cited

U.S. PATENT DOCUMENTS

| | | | |
|---|---|---|---|
| 2017/0034949 A1* | 2/2017 | Yokoi | H05K 7/20254 |
| 2017/0154837 A1* | 6/2017 | Sasaki | H10W 40/258 |
| 2017/0162484 A1 | 6/2017 | Mochizuki et al. | |
| 2018/0132388 A1 | 5/2018 | Hayashi et al. | |
| 2020/0211926 A1* | 7/2020 | Tahara | H10W 40/255 |
| 2020/0365486 A1* | 11/2020 | Huang | H01L 21/56 |
| 2022/0157959 A1* | 5/2022 | Kim | H10D 62/107 |

FOREIGN PATENT DOCUMENTS

| | | |
|---|---|---|
| JP | S63-037698 A | 2/1988 |
| JP | 2003-017628 A | 1/2003 |
| JP | 2010-062491 A | 3/2010 |
| JP | 2012-222000 A | 11/2012 |
| JP | 2017-098442 A | 6/2017 |
| JP | 2017-224750 A | 12/2017 |
| WO | 2015/198893 A1 | 12/2015 |

OTHER PUBLICATIONS

International Search Report issued in PCT/JP2020/028186; mailed Oct. 6, 2020.
An Office Action; mailed by the China National Intellectual Property Administration of the People's Republic of China on May 27, 2025, which corresponds to Chinese Patent Application No. 202080104815.8 and is related to U.S. Appl. No. 17/997,120.
"Decision of Refusal" Office Action issued in CN 202080104815.8; mailed by the China National Intellectual Property Administration on Oct. 17, 2025.

* cited by examiner

F I G. 1
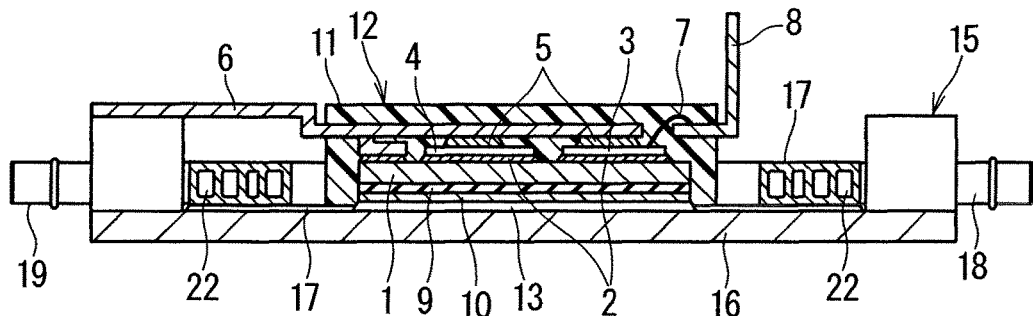
F I G. 2
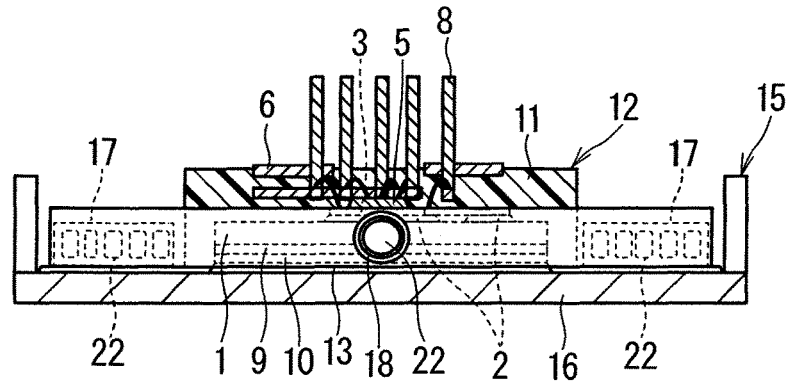
F I G. 3
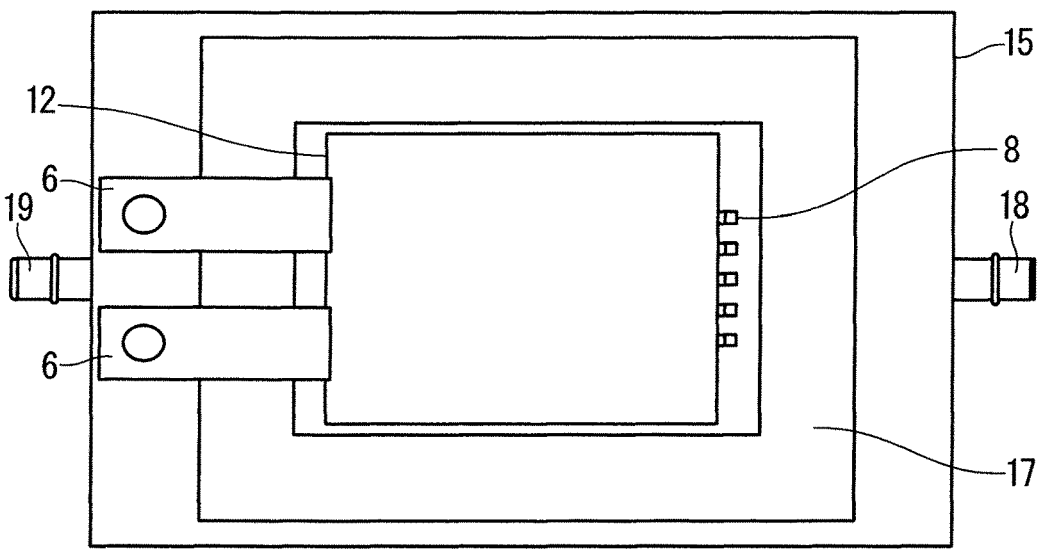

F I G. 4
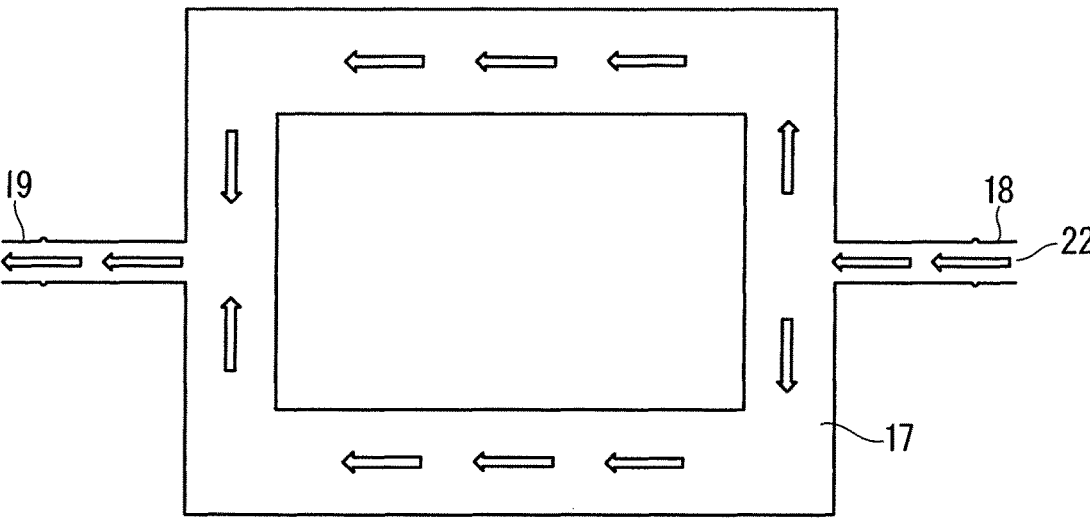
F I G. 5
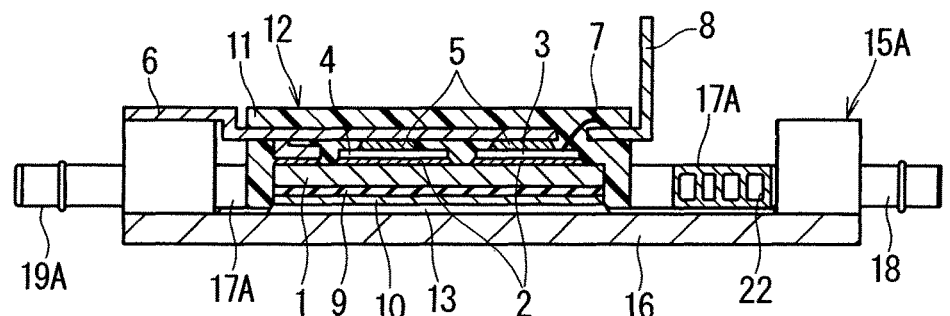
F I G. 6
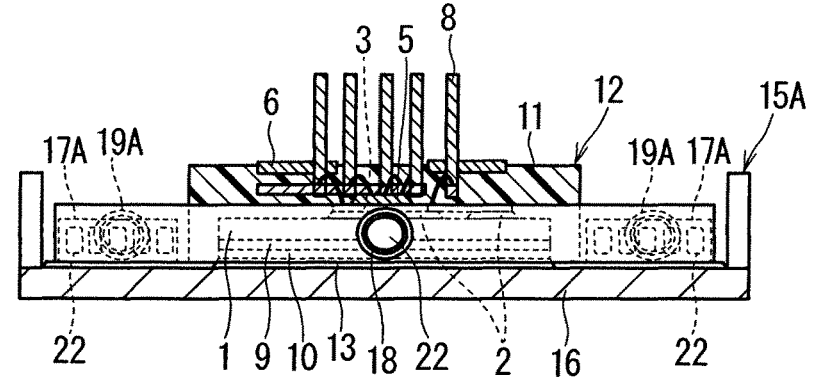

F I G. 7
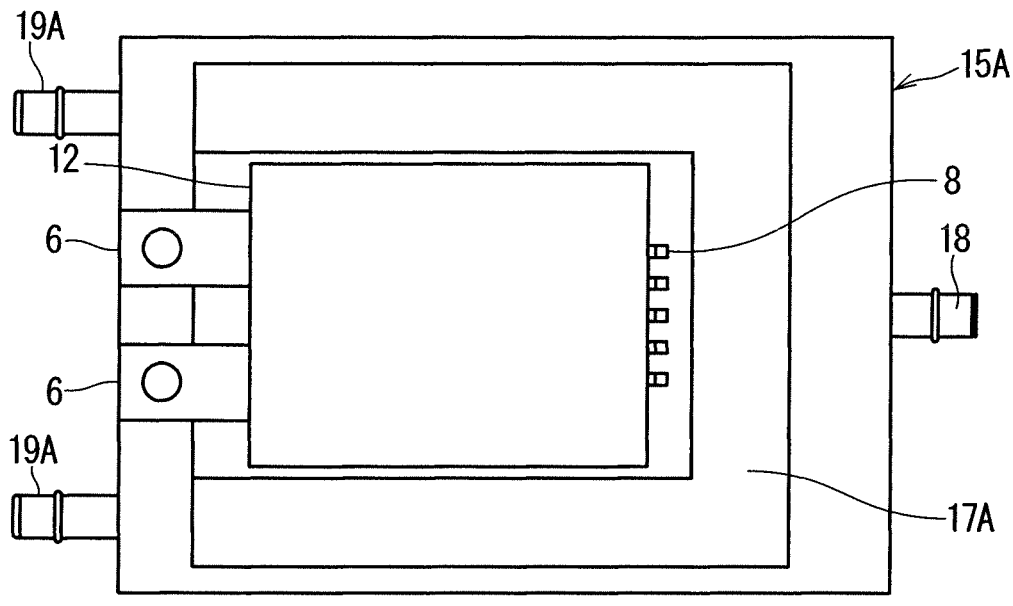
F I G. 8
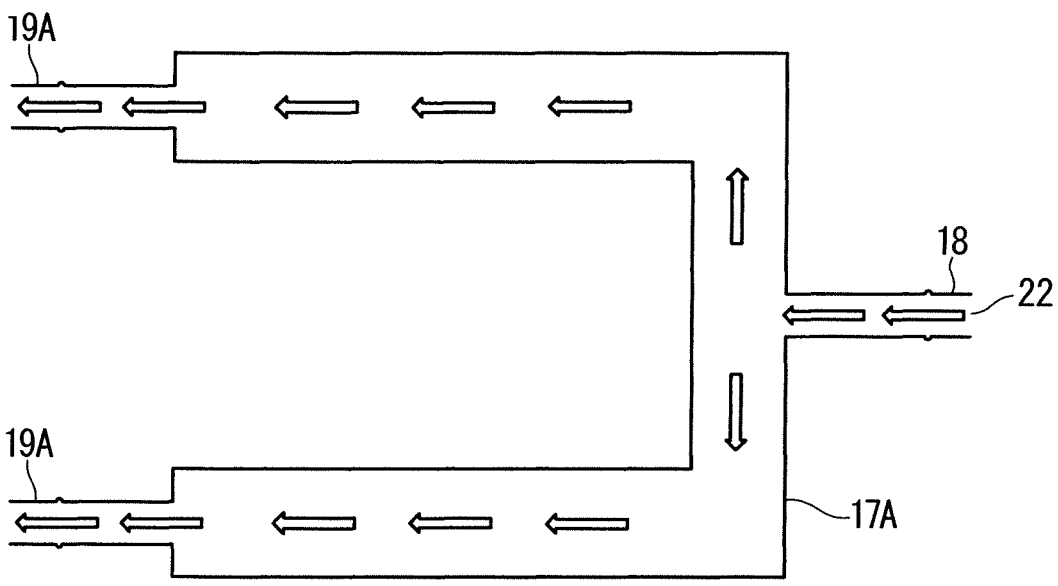

F I G. 9
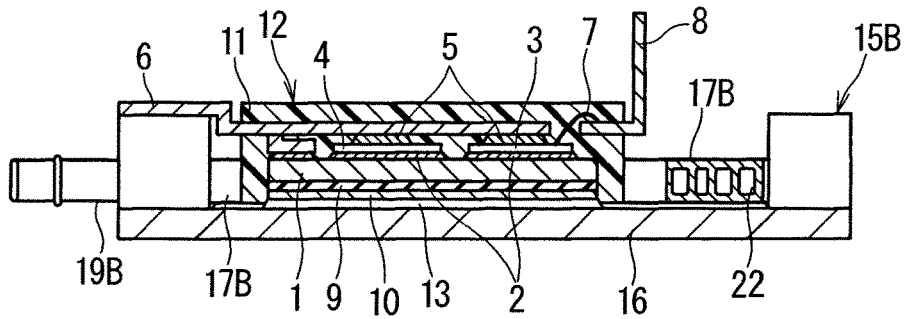
F I G. 10
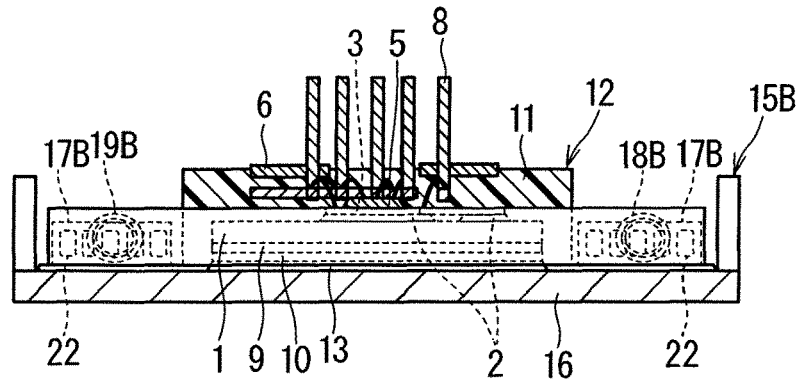
F I G. 11
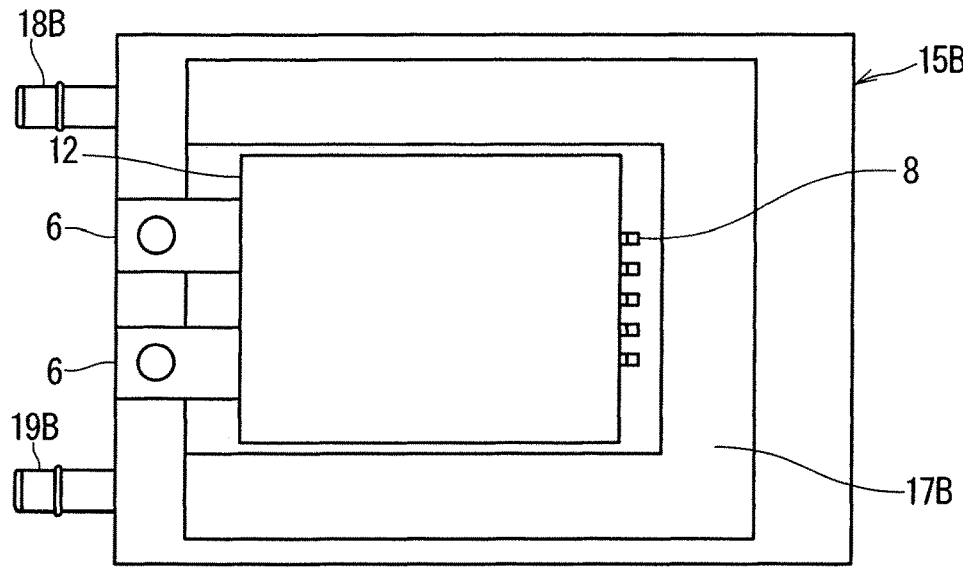

F I G. 12
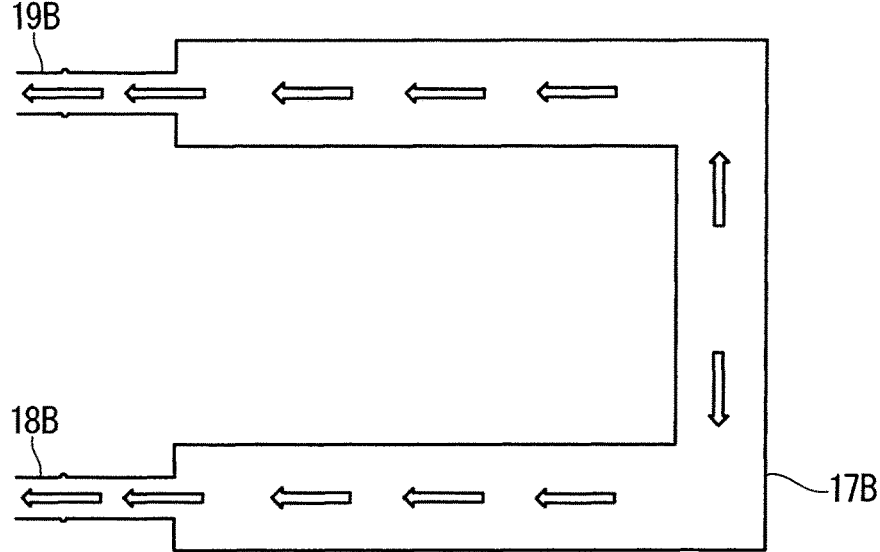
F I G. 13
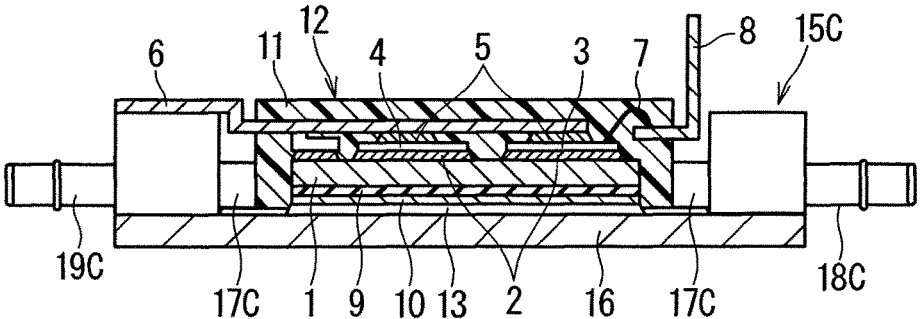
F I G. 14
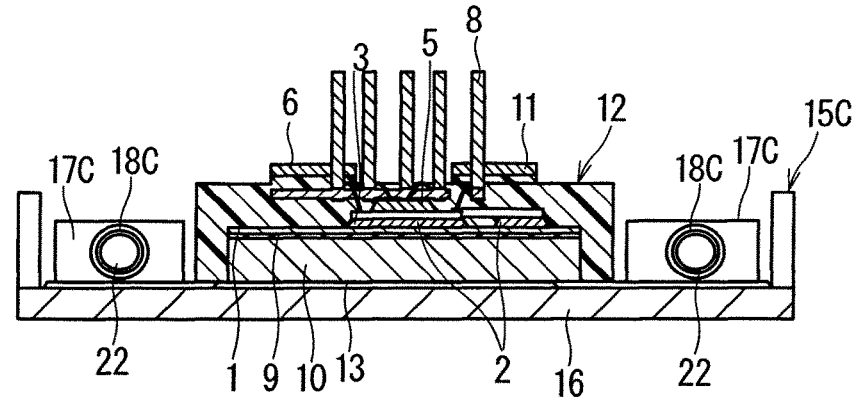

F I G. 15
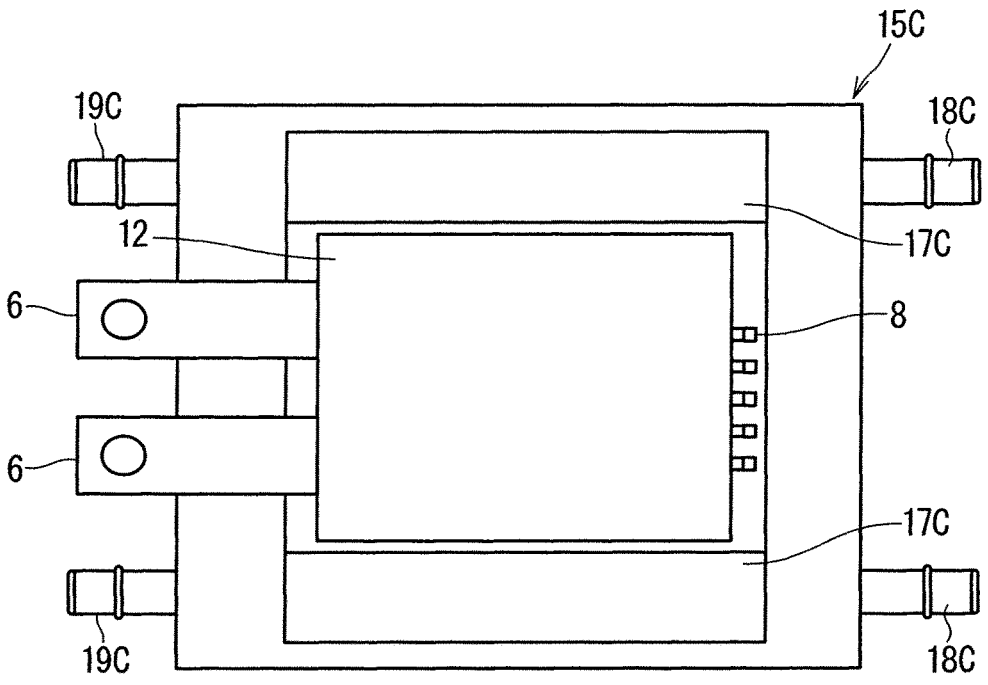
F I G. 16
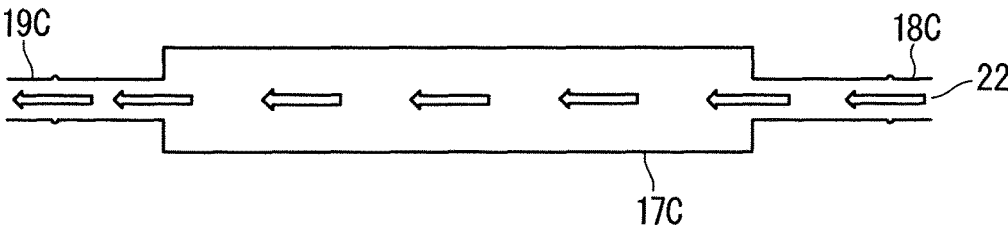
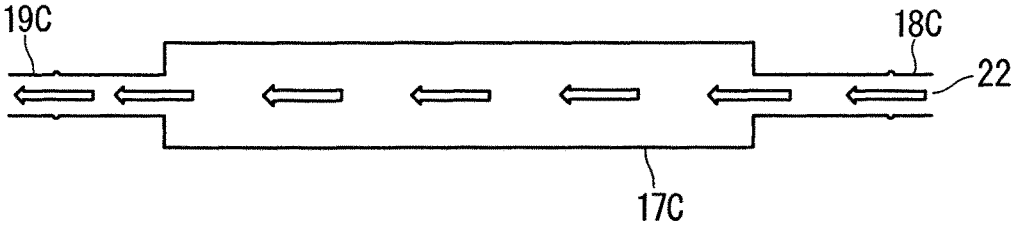

F I G. 2 0
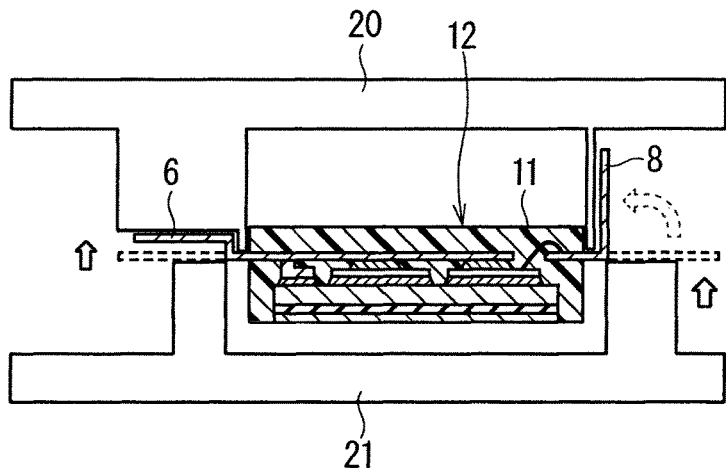
F I G. 2 1
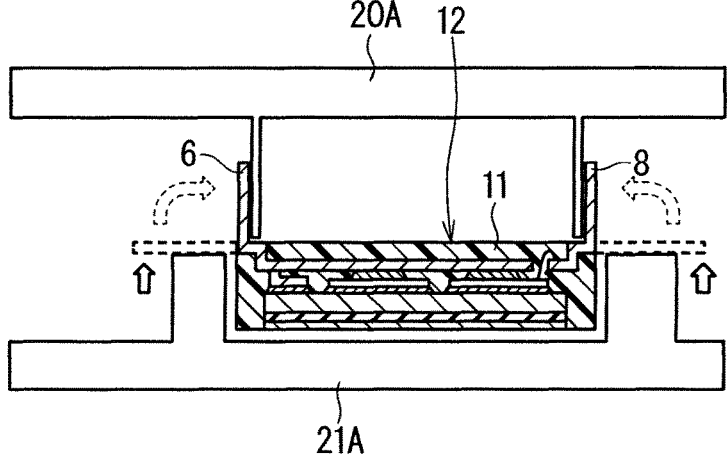
F I G. 2 2
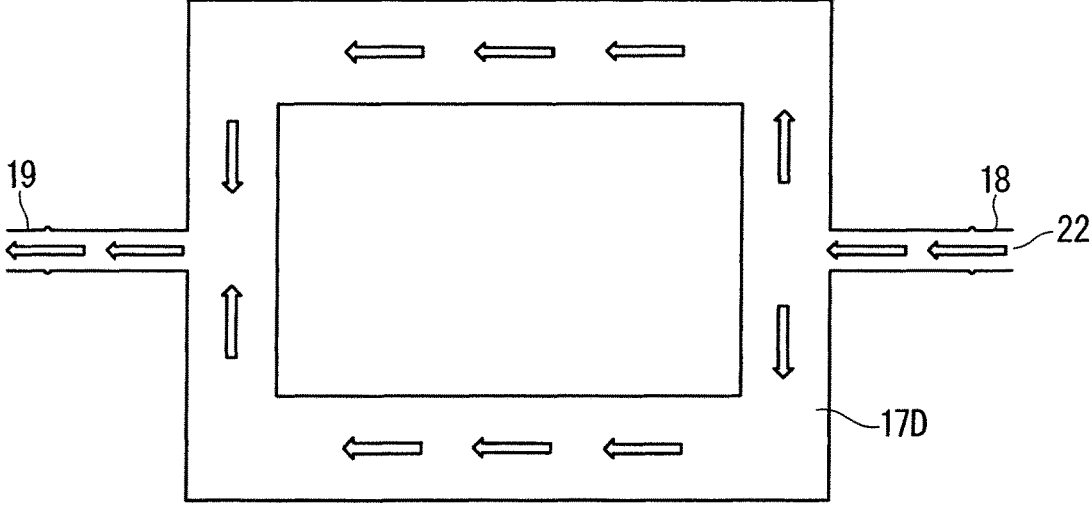

F I G. 29
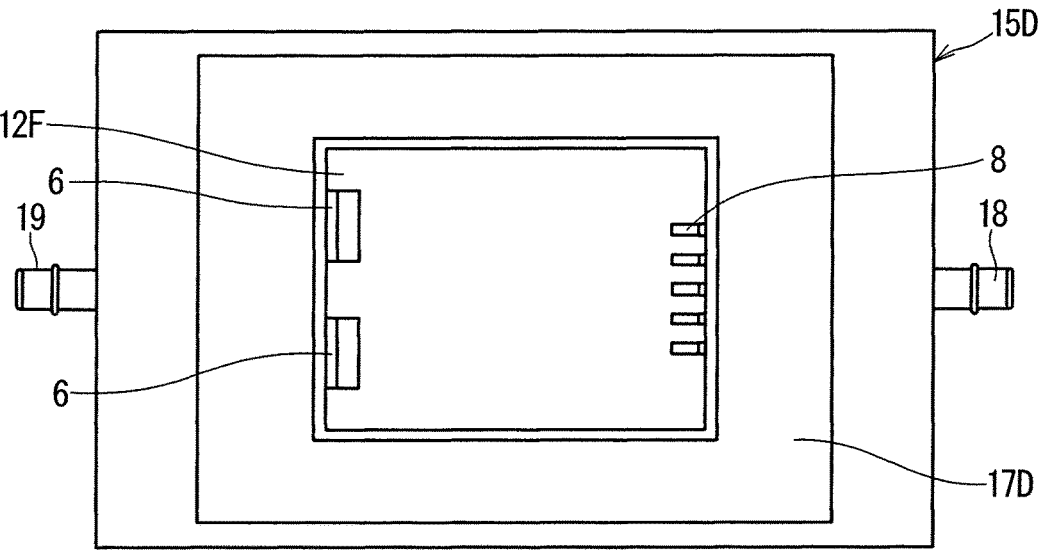
F I G. 30
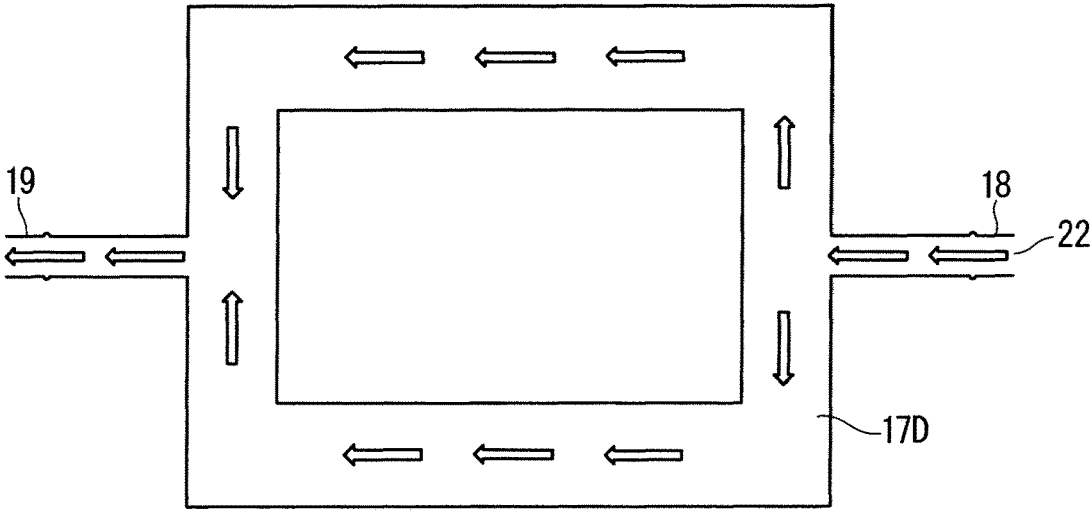
F I G. 31
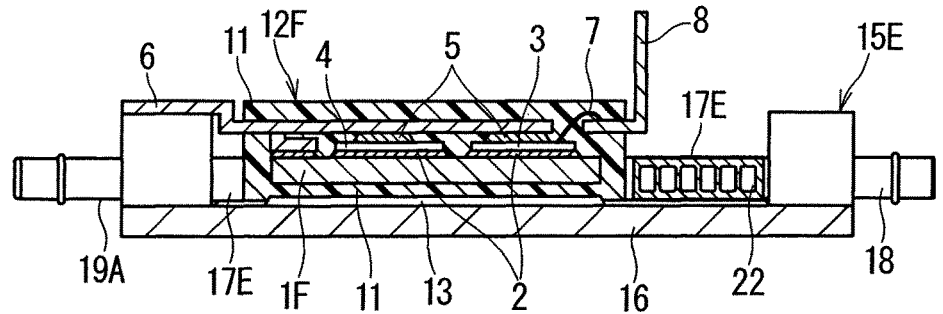

F I G. 4 6
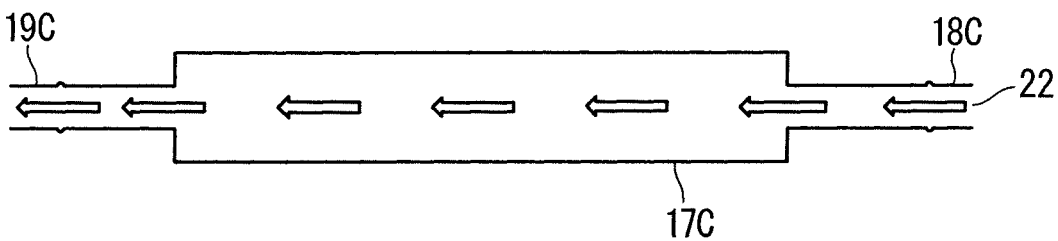
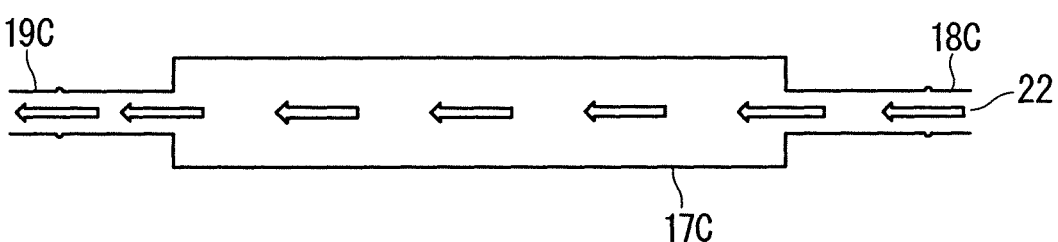
F I G. 4 7
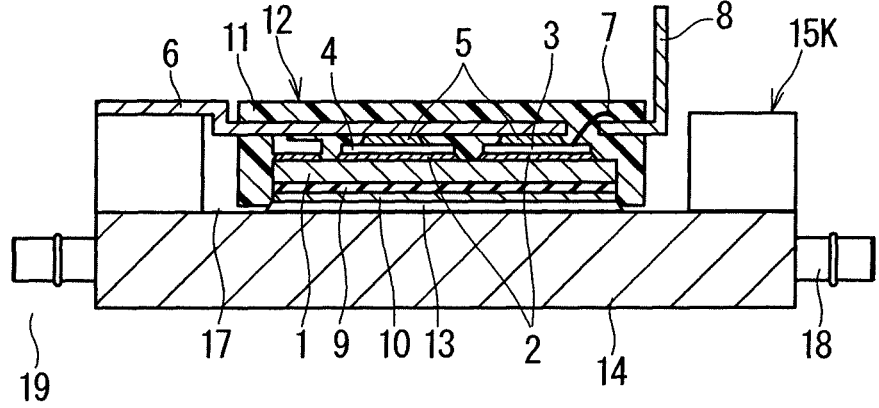

SEMICONDUCTOR DEVICE

TECHNICAL FIELD

The technique disclosed in the specification of the present application relates to a semiconductor device.

BACKGROUND ART

For example, Patent Document 1 discloses a semiconductor device having a semiconductor module joined to a cooler. The semiconductor module is in contact with a cooler with interposition of a metal block exposed from the lower surface of the molding resin, and dissipates generated heat.

PRIOR ART DOCUMENT

Patent Document

Patent Document 1: Japanese Patent Application Laid-Open No. 2012-222000

SUMMARY

Problem to be Solved by the Invention

In the technique disclosed in Patent Document 1, a cooler for water cooling formed of aluminum or the like is disposed on a lower surface of a semiconductor device. Therefore, there is a problem that the height of the entire structure of the semiconductor device increases.

The technique disclosed in the specification of the present application has been made in view of the above-described problems, and is a technique for effectively dissipating heat from a semiconductor device while keeping the height of the semiconductor device low.

Means to Solve the Problem

A semiconductor device according to a first aspect of the technique disclosed in the specification of the present application includes: a semiconductor module; and a cooler configured to cool the semiconductor module. The semiconductor module includes: a metal block, a semiconductor element provided on an upper surface of the metal block, a terminal connected to the semiconductor element, and a resin covering a part of the terminal, the metal block, and the semiconductor element. The cooler includes: a metal base provided in a region including the semiconductor module in a plan view while being in contact with a lower surface of the semiconductor module, and a cooling pipe disposed on an upper surface of the metal base, the cooling pipe being configured to circulate a refrigerant for cooling the semiconductor module. The cooling pipe is provided to at least partially surround the semiconductor module in a plan view.

Effects of the Invention

According to at least the first aspect of the technique disclosed in the specification of the present application, since the cooling pipe of the cooler is disposed to surround the semiconductor module in a plan view, the height of the entire structure of the semiconductor device can be kept low.

In addition, the objects, features, aspects, and advantages related to the technique disclosed in the specification of the present application will become further apparent from the detailed description and the accompanying drawings shown hereinafter.

BRIEF DESCRIPTION OF DRAWINGS

FIG. 1 is a cross-sectional view schematically showing an example of a configuration of a semiconductor device according to an embodiment.

FIG. 2 is a cross-sectional view from another direction schematically showing an example of a configuration of a semiconductor device according to an embodiment.

FIG. 3 is a plan view schematically showing an example of a configuration of a semiconductor device according to an embodiment.

FIG. 4 is a view schematically showing a flow of circulation of cooling water in a cooler.

FIG. 5 is a cross-sectional view schematically showing an example of a configuration of a semiconductor device according to an embodiment.

FIG. 6 is a cross-sectional view from another direction schematically showing an example of a configuration of a semiconductor device according to an embodiment.

FIG. 7 is a plan view schematically showing an example of a configuration of a semiconductor device according to an embodiment.

FIG. 8 is a view schematically showing a flow of circulation of cooling water in a cooler.

FIG. 9 is a cross-sectional view schematically showing an example of a configuration of a semiconductor device according to an embodiment.

FIG. 10 is a cross-sectional view from another direction schematically showing an example of a configuration of a semiconductor device according to an embodiment.

FIG. 11 is a plan view schematically showing an example of a configuration of a semiconductor device according to an embodiment.

FIG. 12 is a view schematically showing a flow of circulation of cooling water in a cooler.

FIG. 13 is a cross-sectional view schematically showing an example of a configuration of a semiconductor device according to an embodiment.

FIG. 14 is a cross-sectional view from another direction schematically showing an example of a configuration of a semiconductor device according to an embodiment.

FIG. 15 is a plan view schematically showing an example of a configuration of a semiconductor device according to an embodiment.

FIG. 16 is a view schematically showing a flow of circulation of cooling water in a cooler.

FIG. 20 is a view showing an example of lead forming when the side surface of the molding resin is not flush.

FIG. 21 is a view showing an example of lead forming when the upper surface and the side surface of the molding resin are flush.

FIG. 22 is a view schematically showing a flow of circulation of cooling water in a cooler.

FIG. 29 is a plan view schematically showing an example of a configuration of a semiconductor device according to an embodiment.

FIG. 30 is a view schematically showing a flow of circulation of cooling water in a cooler.

FIG. 31 is a cross-sectional view schematically showing an example of a configuration of a semiconductor device according to an embodiment.

FIG. 46 is a view schematically showing a flow of circulation of cooling water in a cooler.

FIG. 47 is a cross-sectional view schematically showing an example of a configuration of a semiconductor device according to an embodiment.

DESCRIPTION OF EMBODIMENTS

Figure 17:
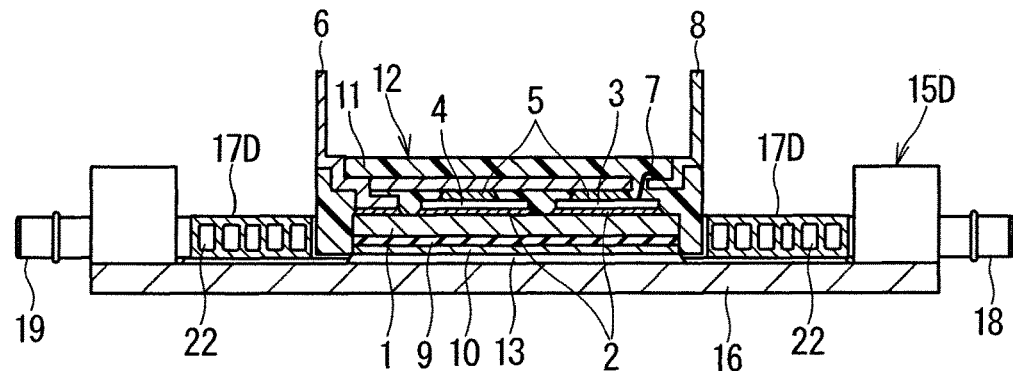
FIG. 17 is a cross-sectional view schematically showing an example of a configuration of a semiconductor device according to an embodiment.

Hereinafter, embodiments will be described with reference to the accompanying drawings. In the following preferred embodiments, detailed features and the like are also shown for the description of the technique, but they are merely examples, and not all of them are necessarily essential features for enabling the preferred embodiments to be carried out.

It should be noted that the drawings are schematically shown, and for convenience of description, the configuration may be omitted or the configuration may be simplified in the drawings as appropriate. In addition, the mutual relationship between the sizes and positions of the respective configurations shown in the different drawings is not necessarily described accurately and can be appropriately changed. In addition, in drawings such as plan views other than cross-sectional views, hatching may be added in order to facilitate understanding of the contents of the embodiments.

In addition, in the following description, the same components are denoted by the same reference numerals to be illustrated, and their names and functions are also the same. Therefore, detailed descriptions thereof may be omitted to avoid redundancy.

In addition, in the following description, when description such as "comprising", "including", or "having" a certain component is made, it is not an exclusive expression excluding the presence of other components unless otherwise noted.

In addition, in the following description, ordinal numbers such as "first" or "second" may be used, but these terms are used to facilitate understanding of the contents of the embodiments for convenience, and are not limited to the order or the like that can be generated by these ordinal numbers.

In addition, in the following description, an expression indicating an equal state, for example, "same", "equal", "uniform", or "homogeneous" is assumed to include a case indicating an exactly equal state and a case where a difference occurs within a range in which a tolerance or a similar function can be obtained, unless otherwise noted.

In addition, in the following description, terms that mean a specific position or direction such as "upper", "lower", "left", "right", "side", "bottom", "front", or "back" may be used, but these terms are used to facilitate understanding of the contents of the embodiments for convenience and are not related to the position or direction at the time of actual implementation.

In addition, in the description given below, when it is described as "the upper surface of . . . ", "the lower surface of . . . ", or the like, it is assumed to include a state in which another component is formed on the upper surface or the lower surface of the target component in addition to the upper surface itself or the lower surface itself of the target component. That is, for example, the description "Second Party provided on the upper surface of First Party" does not preclude the interposition of another component "Third Party" between First Party and Second Party.

First Embodiment

Hereinafter, a semiconductor device according to the present embodiment will be described. For convenience of description, first, a technique related to a configuration of a semiconductor device known by the inventor will be described.

Figure 48:
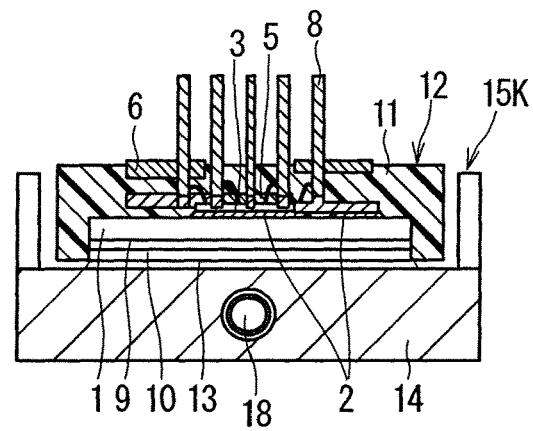
FIG. 48 is a cross-sectional view from another direction schematically showing an example of a configuration of a semiconductor device according to an embodiment.

FIG. 47 is a cross-sectional view schematically showing an example of the configuration of the semiconductor device according to the present embodiment. In addition, FIG. 48 is a cross-sectional view from another direction schematically showing an example of a configuration of a semiconductor device according to the present embodiment. In addition, FIG. 49 is a plan view schematically showing an example of the configuration of the semiconductor device according to the present embodiment.

Figure 49:
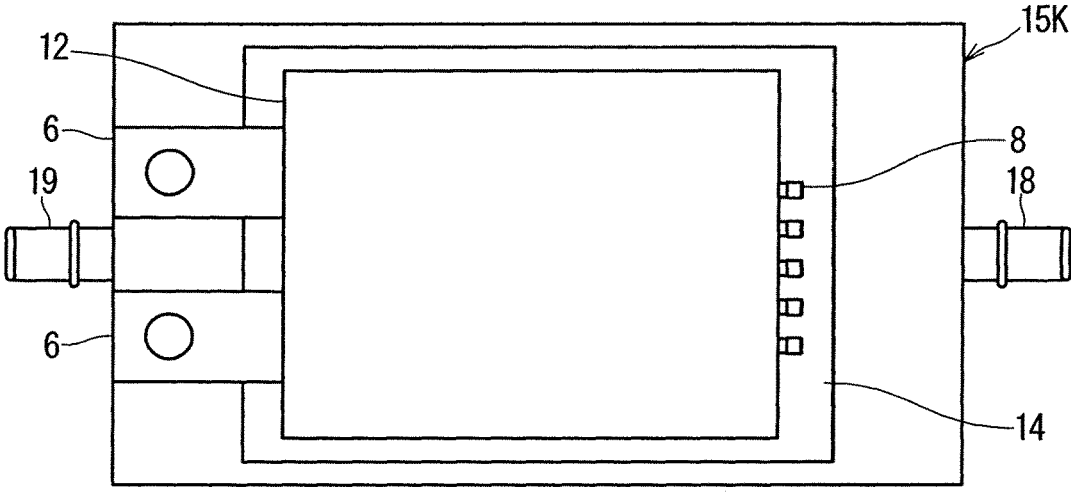
FIG. 49 is a plan view schematically showing an example of a configuration of a semiconductor device according to an embodiment.

As shown with an example in FIGS. 47, 48, and 49, the semiconductor device includes a resin package module 12 and a cooler 15K that cools the resin package module 12 by water cooling.

The resin package module 12 includes: a metal block 1 formed of copper or the like; a semiconductor element 3 including silicon (Si) or the like joined to an upper surface of the metal block 1 with interposition of a brazing material 2 such as solder; a semiconductor element 4 including silicon (Si) or the like joined to an upper surface of the metal block 1 with interposition of a brazing material 2 such as solder; a main terminal 6 formed of copper or the like joined to an upper surface of the semiconductor element 3 and an upper surface of the semiconductor element 4 with interposition of a brazing material 5 such as solder; a signal terminal 8 formed of copper or the like connected to the semiconductor element 3 with interposition of a wire bond 7 formed of aluminum or the like; an insulating material 9 formed of an epoxy resin, ceramic, or the like provided on a lower surface of the metal block 1; a metal plate 10 formed of copper or the like provided on a lower surface of the insulating material 9; and a molding resin 11 formed by sealing the above-described configuration while exposing a part of the main terminal 6, a part of the signal terminal 8, and the lower surface of the metal plate 10. Here, each of the main terminal 6 and the signal terminal 8 protrudes from the side surface of the molding resin 11.

The cooler 15K formed of aluminum or the like is disposed in contact with a lower surface of the resin package module 12, specifically, a lower surface of the metal plate 10 while being disposed at a position overlapping the resin package module 12 in a plan view.

The cooler 15K includes: a metal base 14 formed of copper or the like in contact with the lower surface of the metal plate 10 with interposition of the heat dissipating grease 13; a cooling water introduction nipple 18 that introduces cooling water 22 into the cooling pipe in the metal base 14; and a cooling water drainage nipple 19 that discharges the cooling water 22 from the cooling pipe in the metal base 14.

Figure 50:
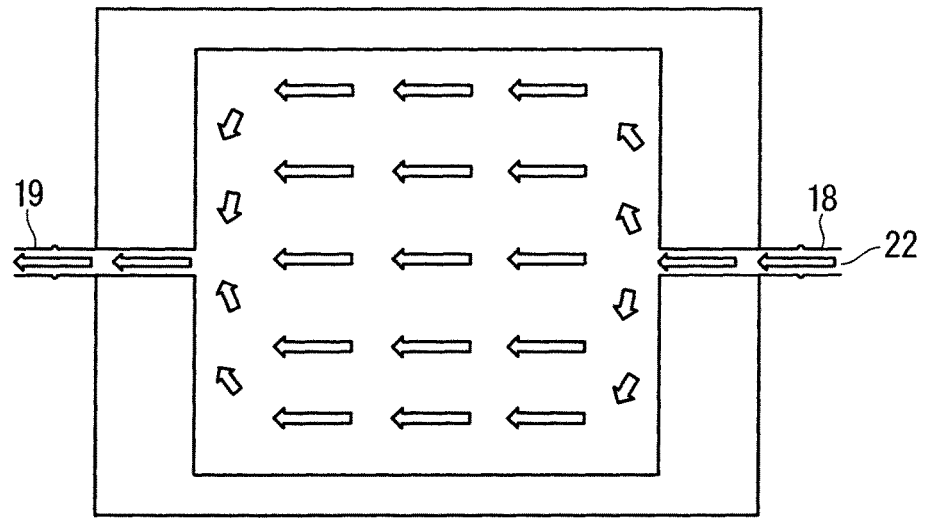
FIG. 50 is a view schematically showing a flow of circulation of cooling water in a cooler.

FIG. 50 is a view schematically showing a flow of circulation of cooling water 22 in the cooler 15K. As shown with an example in FIG. 50, the cooler 15K circulates the cooling water 22 through the cooling pipe in the metal base 14. Accordingly, the cooler 15K cools the resin package module 12 through the metal base 14.

<Configuration of Semiconductor Device>

FIG. 1 is a cross-sectional view schematically showing an example of the configuration of the semiconductor device according to the present embodiment. In addition, FIG. 2 is a cross-sectional view from another direction schematically showing an example of a configuration of a semiconductor device according to the present embodiment. In addition, FIG. 3 is a plan view schematically showing an example of the configuration of the semiconductor device according to the present embodiment.

As shown with an example in FIGS. 1, 2, and 3, the semiconductor device includes a resin package module 12 and a cooler 15 that cools the resin package module 12 by water cooling.

The resin package module 12 includes: a metal block 1 formed of copper or the like; a semiconductor element 3 including silicon (Si) or the like joined to an upper surface of the metal block 1 with interposition of a brazing material 2 such as solder; a semiconductor element 4 including silicon (Si) or the like joined to an upper surface of the metal block 1 with interposition of a brazing material 2 such as solder; a main terminal 6 formed of copper or the like connected to an upper surface of the semiconductor element 3 and an upper surface of the semiconductor element 4 with interposition of a brazing material 5 such as solder; a signal terminal 8 formed of copper or the like connected to the semiconductor element 3 with interposition of a wire bond 7 formed of aluminum or the like; an insulating material 9 formed of an epoxy resin, ceramic, or the like provided on a lower surface of the metal block 1; a metal plate 10 formed of copper or the like provided on a lower surface of the insulating material 9; and a molding resin 11 formed by sealing the above-described configuration while exposing a part of the main terminal 6, a part of the signal terminal 8, and the lower surface of the metal plate 10. Here, each of the main terminal 6 and the signal terminal 8 protrudes from the side surface of the molding resin 11.

The cooler 15 formed of aluminum or the like is disposed in contact with a lower surface of the resin package module 12, specifically, a lower surface of the metal plate 10 while surrounding the resin package module 12 in a plan view.

The cooler 15 includes: a metal base 16 provided in a region larger than a region overlapping the resin package module 12 in a plan view, the metal base 16 being formed of copper or the like in contact with a lower surface of a metal plate 10 with interposition of heat dissipating grease 13; a cooling pipe 17 disposed on an upper surface of the metal base 16, the cooling pipe 17 being formed of aluminum or the like disposed to surround an entire periphery of the resin package module 12 in a plan view; a cooling water introduction nipple 18 configured to introduce the cooling water 22 into the cooling pipe 17; and a cooling water drainage nipple 19 configured to discharge the cooling water 22 from the cooling pipe 17. It should be noted that the cooler 15 according to the present embodiment cools the resin package module 12 by water cooling of cooling water 22 circulating in the cooling pipe 17, but may cool the resin package module 12 by a method using another refrigerant such as air cooling of gas circulating in the cooling pipe 17. The same applies to a cooler according to another embodiment.

FIG. 4 is a view schematically showing a flow of circulation of cooling water 22 in the cooler 15. As shown with an example in FIG. 4, the cooler 15 circulates cooling water 22 through the cooling pipe 17. Accordingly, the cooler 15 cools the resin package module 12 through the metal base 16.

Specifically, the cooler 15 dissipates heat generated from the semiconductor element 3 and heat generated from the semiconductor element 4, which are transferred through the metal block 1, the insulating material 9, the metal plate 10, and the heat dissipating grease 13 in the resin package module 12, by cooling water 22 circulating in the cooling pipe 17 through the metal base 16.

It should be noted that the semiconductor element 3 is, for example, an insulated gate bipolar transistor (IGBT), a metal-oxide-semiconductor field effect transistor (MOS-FET), or the like. In addition, the semiconductor element 4 is, for example, a diode.

In addition, as a semiconductor used for the semiconductor element 3 and the semiconductor element 4, a wide band gap semiconductor such as silicon carbide (SiC) is assumed in addition to silicon (Si), for example. Here, the wide band gap semiconductor generally refers to a semiconductor having a forbidden band width of about 2 eV or more, and known are Group 3 nitrides such as gallium nitride (GaN), Group 2 oxides such as zinc oxide (ZnO), Group 2 chalcogenides such as zinc selenide (ZnSe), diamond, and silicon carbide. Although the case where silicon carbide is used is described in the present embodiment, the same applies to other semiconductors and wide band gap semiconductors.

According to the above configuration, since the cooling pipe 17 of the cooler 15 is disposed to surround the resin package module 12 in a plan view, the height of the entire structure of the semiconductor device can be kept low.

Second Embodiment

A semiconductor device according to the present embodiment will be described. It should be noted that in the following description, the same components as those described in the embodiment described above are denoted by the same reference numerals and illustrated, and the detailed description thereof will be appropriately omitted.
<Configuration of Semiconductor Device>

FIG. 5 is a cross-sectional view schematically showing an example of the configuration of the semiconductor device according to the present embodiment. In addition, FIG. 6 is a cross-sectional view from another direction schematically showing an example of a configuration of a semiconductor device according to the present embodiment. In addition, FIG. 7 is a plan view schematically showing an example of the configuration of the semiconductor device according to the present embodiment.

As shown with an example in FIGS. 5, 6, and 7, the semiconductor device includes a resin package module 12 and a cooler 15A that cools the resin package module 12 by water cooling.

The cooler 15A formed of aluminum or the like is disposed in contact with a lower surface of the resin package module 12, specifically, a lower surface of the metal plate 10 while surrounding the resin package module 12 in a plan view.

The cooler 15A includes: a metal base 16 formed of copper or the like in contact with a lower surface of the metal plate 10 with interposition of the heat dissipating grease 13; a cooling pipe 17A disposed on an upper surface of the metal base 16, the cooling pipe 17A being formed of aluminum or the like disposed to partially (that is, only a part of the side surface) surround the resin package module 12 in a plan view; a cooling water introduction nipple 18 configured to introduce the cooling water 22 into the cooling pipe 17A; and two cooling water drainage nipples 19A configured to discharge the cooling water 22 from the cooling pipe 17A.

The cooling water introduction nipple 18 is provided in a linear portion of the cooling pipe 17A partially surrounding the resin package module 12 in a plan view. In addition, the two cooling water drainage nipples 19A are provided at both ends of the cooling pipe 17A partially surrounding the resin package module 12 in a plan view.

FIG. 8 is a view schematically showing a flow of circulation of cooling water 22 in the cooler 15A. As shown with an example in FIG. 8, the cooler 15A circulates cooling water 22 through the cooling pipe 17A. Accordingly, the cooler 15A cools the resin package module 12 through the metal base 16.

Specifically, the cooler 15A dissipates heat generated from the semiconductor element 3 and heat generated from the semiconductor element 4, which are transferred through the metal block 1, the insulating material 9, the metal plate 10, and the heat dissipating grease 13 in the resin package module 12, by cooling water 22 circulating in the cooling pipe 17A through the metal base 16.

According to the above configuration, since the cooling pipe 17A of the cooler 15A is disposed to partially surround the resin package module 12 in a plan view, the height of the entire structure of the semiconductor device can be kept low. In addition, since the cooling pipe 17A is disposed without surrounding the entire periphery of the resin package module 12 in a plan view, the occupied area (foot space) of the semiconductor device can be reduced.

Third Embodiment

A semiconductor device according to the present embodiment will be described. It should be noted that in the following description, the same components as those described in the embodiment described above are denoted by the same reference numerals and illustrated, and the detailed description thereof will be appropriately omitted.
<Configuration of Semiconductor Device>

FIG. 9 is a cross-sectional view schematically showing an example of the configuration of the semiconductor device according to the present embodiment. In addition, FIG. 10 is a cross-sectional view from another direction schematically showing an example of a configuration of a semiconductor device according to the present embodiment. In addition, FIG. 11 is a plan view schematically showing an example of the configuration of the semiconductor device according to the present embodiment.

As shown with an example in FIGS. 9, 10, and 11, the semiconductor device includes a resin package module 12 and a cooler 15B that cools the resin package module 12 by water cooling.

The cooler 15B formed of aluminum or the like is disposed in contact with a lower surface of the resin package module 12, specifically, a lower surface of the metal plate 10 while surrounding the resin package module 12 in a plan view.

The cooler 15B includes: a metal base 16 formed of copper or the like in contact with a lower surface of the metal plate 10 with interposition of the heat dissipating grease 13; a cooling pipe 17B disposed on an upper surface of the metal base 16, the cooling pipe 17B being formed of aluminum or the like disposed to partially surround the resin package module 12 in a plan view; a cooling water introduction nipple 18B configured to introduce the cooling water 22 into the cooling pipe 17B; and a cooling water drainage nipple 19B configured to discharge the cooling water 22 from the cooling pipe 17B.

The cooling water introduction nipple 18B is provided at one end in the longitudinal direction of the cooling pipe 17B partially surrounding the resin package module 12 in a plan view. In addition, the cooling water drainage nipple 19B is provided at the other end in the longitudinal direction of the cooling pipe 17B partially surrounding the resin package module 12 in a plan view.

FIG. 12 is a view schematically showing a flow of circulation of cooling water 22 in the cooler 15B. As shown with an example in FIG. 12, the cooler 15B circulates cooling water 22 through the cooling pipe 17B. Accordingly, the cooler 15B cools the resin package module 12 through the metal base 16.

Specifically, the cooler 15B dissipates heat generated from the semiconductor element 3 and heat generated from the semiconductor element 4, which are transferred through the metal block 1, the insulating material 9, the metal plate 10, and the heat dissipating grease 13 in the resin package module 12, by cooling water 22 circulating in the cooling pipe 17B through the metal base 16. It should be noted that the shape of the cooling pipe 17B illustrated in FIG. 12 is also applicable to other embodiments.

According to the above configuration, since the cooling pipe 17B of the cooler 15B is disposed to partially surround the resin package module 12 in a plan view, the height of the entire structure of the semiconductor device can be kept low. In addition, since the cooling pipe 17B is disposed without surrounding the entire periphery of the resin package module 12 in a plan view, the occupied area (foot space) of the semiconductor device can be reduced. In addition, since the nipple is not provided in the linear portion of the cooling pipe 17B, it is possible to suppress the manufacturing cost or improve the assembling property.

Fourth Embodiment

A semiconductor device according to the present embodiment will be described. It should be noted that in the following description, the same components as those described in the embodiment described above are denoted by the same reference numerals and illustrated, and the detailed description thereof will be appropriately omitted.
<Configuration of Semiconductor Device>

FIG. 13 is a cross-sectional view schematically showing an example of the configuration of the semiconductor device according to the present embodiment. In addition, FIG. 14 is a cross-sectional view from another direction schematically showing an example of a configuration of a semiconductor device according to the present embodiment. In addition, FIG. 15 is a plan view schematically showing an example of the configuration of the semiconductor device according to the present embodiment.

As shown with an example in FIGS. 13, 14, and 15, the semiconductor device includes a resin package module 12 and a cooler 15C that cools the resin package module 12 by water cooling.

The cooler 15C formed of aluminum or the like is disposed in contact with a lower surface of the resin package module 12, specifically, a lower surface of the metal plate 10 while surrounding the resin package module 12 in a plan view.

The cooler 15C includes: a metal base 16 formed of copper or the like in contact with a lower surface of the metal plate 10 with interposition of the heat dissipating grease 13; a cooling pipe 17C disposed on an upper surface of the metal base 16, the cooling pipe 17C being formed of aluminum or the like disposed to surround a pair of facing side surfaces of the resin package module 12 in a plan view; a cooling water introduction nipple 18C configured to introduce the cooling water 22 into the cooling pipe 17C; and a cooling water drainage nipple 19C configured to discharge the cooling water 22 from the cooling pipe 17C.

The cooling pipe 17C is a linear pipe along sides facing each other, and is disposed to be divided into two places. Then, the cooling water introduction nipple 18C is provided at one end of each of the cooling pipes 17C. In addition, the cooling water drainage nipple 19C is provided at the other end of each of the cooling pipes 17C.

FIG. 16 is a view schematically showing a flow of circulation of cooling water 22 in the cooler 15C. As shown with an example in FIG. 16, the cooler 15C circulates cooling water 22 through the cooling pipe 17C. Accordingly, the cooler 15C cools the resin package module 12 through the metal base 16.

Specifically, the cooler 15C dissipates heat generated from the semiconductor element 3 and heat generated from the semiconductor element 4, which are transferred through the metal block 1, the insulating material 9, the metal plate 10, and the heat dissipating grease 13 in the resin package module 12, by cooling water 22 circulating in the cooling pipe 17C through the metal base 16.

According to the above configuration, since the cooling pipe 17C of the cooler 15C is disposed to surround only a pair of facing side surfaces of the resin package module 12 in a plan view, the height of the entire structure of the semiconductor device can be kept low. In addition, since the cooling pipe 17C is disposed without surrounding the entire periphery of the resin package module 12 in a plan view, the occupied area (foot space) of the semiconductor device can be reduced.

Fifth Embodiment

A semiconductor device according to the present embodiment will be described. It should be noted that in the following description, the same components as those described in the embodiment described above are denoted by the same reference numerals and illustrated, and the detailed description thereof will be appropriately omitted.
<Configuration of Semiconductor Device>

Figure 18:
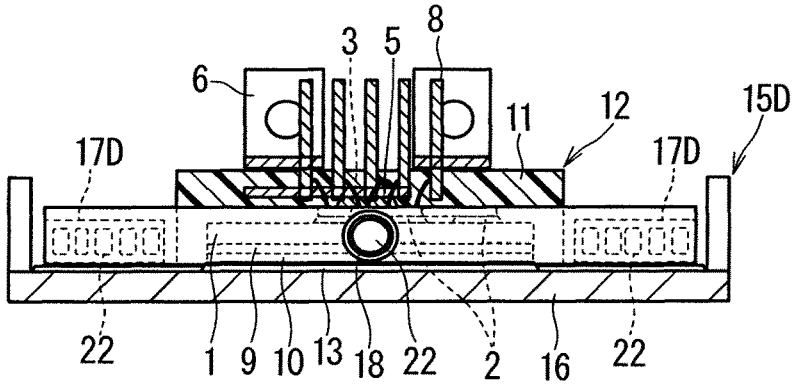
FIG. 18 is a cross-sectional view from another direction schematically showing an example of a configuration of a semiconductor device according to an embodiment.

FIG. 17 is a cross-sectional view schematically showing an example of the configuration of the semiconductor device according to the present embodiment. In addition, FIG. 18 is a cross-sectional view from another direction schematically showing an example of a configuration of a semiconductor device according to the present embodiment. In addition, FIG. 19 is a plan view schematically showing an example of the configuration of the semiconductor device according to the present embodiment.

Figure 19:
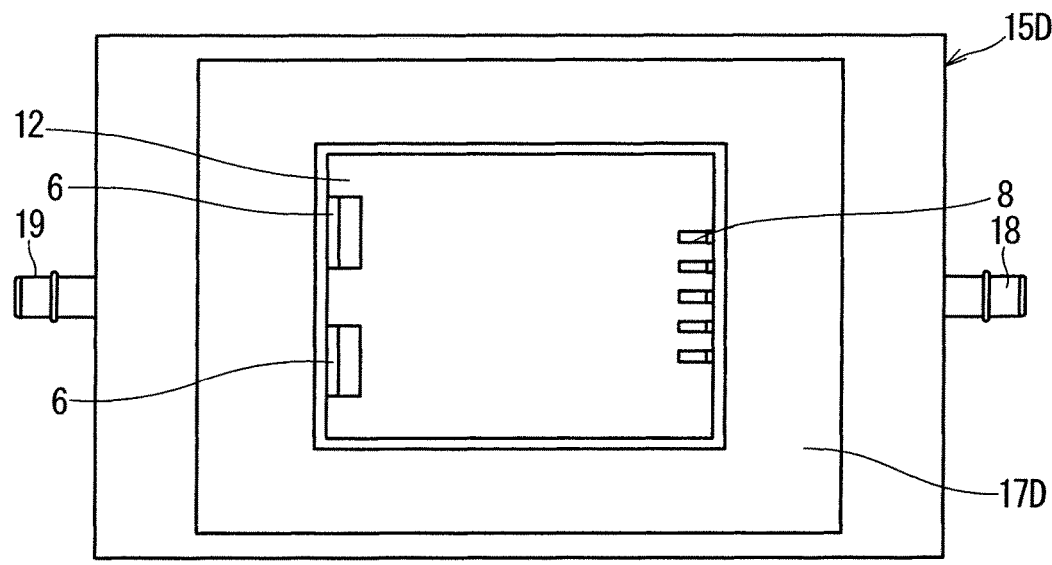
FIG. 19 is a plan view schematically showing an example of a configuration of a semiconductor device according to an embodiment.

As shown with an example in FIGS. 17, 18, and 19, the semiconductor device includes a resin package module 12 and a cooler 15D that cools the resin package module 12 by water cooling.

The cooler 15D formed of aluminum or the like is disposed in contact with a lower surface of the resin package module 12, specifically, a lower surface of the metal plate 10 while surrounding the resin package module 12 in a plan view.

The cooler 15D includes: a metal base 16 formed of copper or the like in contact with a lower surface of the metal plate 10 with interposition of the heat dissipating grease 13; a cooling pipe 17D disposed on an upper surface of the metal base 16, the cooling pipe 17D being formed of aluminum or the like disposed to surround the entire periphery of the resin package module 12 in a plan view; a cooling water introduction nipple 18 configured to introduce the cooling water 22 into the cooling pipe 17D; and a cooling water drainage nipple 19 configured to discharge the cooling water 22 from the cooling pipe 17D.

Here, in the cooling pipe 17D, an inner side surface surrounding the resin package module 12 is in contact with a side surface of the resin package module 12 with interposition of heat dissipating grease 13 (not shown) or the like.

It should be noted that when contact of the inner side surface of the cooling pipe 17D with the side surface of the resin package module 12 makes it difficult to secure the circular surface distance and the space distance of the main terminal 6 and the signal terminal 8 protruding from the side surface of the resin package module 12, these terminals may be changed to protrude from the upper surface of the resin package module 12.

In the lead forming of the main terminal 6 and the signal terminal 8 in this case, the main terminal 6 and the signal terminal 8 are formed so as to be exposed at a corner portion of the upper surface of the molding resin 11 and to extend along the upper surface so as to be flush with the upper surface of the molding resin 11. Then, the main terminal 6 and the signal terminal 8 are formed so as to extend from the corner portion of the upper surface of the molding resin 11 toward the upper side of the molding resin 11 so as to be flush with the side surface of molding resin 11.

FIG. 20 is a view showing an example of lead forming when the side surface of the molding resin 11 is not flush. In addition, FIG. 21 is a view showing an example of lead forming when the upper surface and the side surface of the molding resin 11 are flush.

In the case shown in FIG. 20, the main terminal 6 and the signal terminal 8 are bent by the lead forming die 20 disposed above and the lead forming die 21 disposed below, but none of them are in a flush relationship with the side surface of the molding resin 11.

On the other hand, in the case shown in FIG. 21, the main terminal 6 and the signal terminal 8 are bent by the lead forming die 20A disposed above and the lead forming die 21A disposed below, and both are formed so as to extend upward while maintaining a flush relationship with the side surface of the molding resin 11. In addition, in the case shown in FIG. 21, the bent main terminal 6 and signal terminal 8 are flush also with the upper surface of the molding resin 11.

FIG. 22 is a view schematically showing a flow of circulation of cooling water 22 in the cooler 15D. As shown with an example in FIG. 22, the cooler 15D circulates cooling water 22 through the cooling pipe 17D. Accordingly, the cooler 15D cools the resin package module 12 through the metal base 16.

Specifically, the cooler 15D dissipates heat generated from the semiconductor element 3 and heat generated from the semiconductor element 4, which are transferred through the metal block 1, the insulating material 9, the metal plate 10, and the heat dissipating grease 13 in the resin package module 12, by cooling water 22 circulating in the cooling pipe 17D through the metal base 16.

In addition, the cooler 15D cools the heat generated from the semiconductor element 3 and the heat generated from the semiconductor element 4 transferred through the metal block 1 and the molding resin 11 in the resin package module 12 by the cooling water 22 circulating in the cooling pipe 17D through the inner side surface in contact with the resin package module 12.

According to the above configuration, since the cooling pipe 17D of the cooler 15D is disposed to surround the resin package module 12 in a plan view, the height of the entire structure of the semiconductor device can be kept low. In addition, since the cooler 15D cools the heat generated from the semiconductor element 3 and the heat generated from the semiconductor element 4 through the inner side surface in contact with the resin package module 12, the cooling efficiency is improved. In addition, with the configuration in which the main terminal 6 and the signal terminal 8 protrude from the upper surface of the molding resin 11, the allowable range of the voltage applied to the semiconductor element 3 and the semiconductor element 4 is extended, so that the quality of the semiconductor device is improved.

Sixth Embodiment

A semiconductor device according to the present embodiment will be described. It should be noted that in the following description, the same components as those described in the embodiment described above are denoted by the same reference numerals and illustrated, and the detailed description thereof will be appropriately omitted.
<Configuration of Semiconductor Device>

Figure 23:
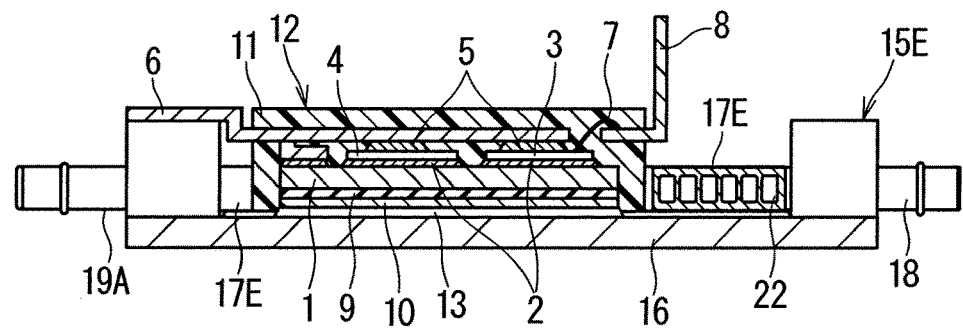
FIG. 23 is a cross-sectional view schematically showing an example of a configuration of a semiconductor device according to an embodiment.
Figure 24:
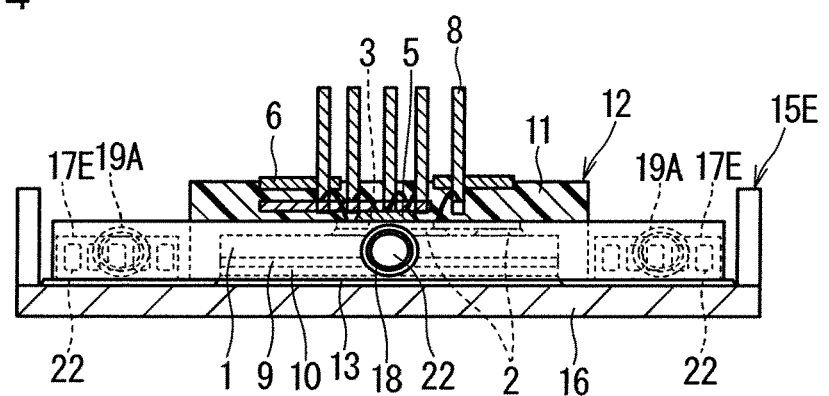
FIG. 24 is a cross-sectional view from another direction schematically showing an example of a configuration of a semiconductor device according to an embodiment.

FIG. 23 is a cross-sectional view schematically showing an example of the configuration of the semiconductor device according to the present embodiment. In addition, FIG. 24 is a cross-sectional view from another direction schematically showing an example of a configuration of a semiconductor device according to the present embodiment. In addition, FIG. 25 is a plan view schematically showing an example of the configuration of the semiconductor device according to the present embodiment.

Figure 25:
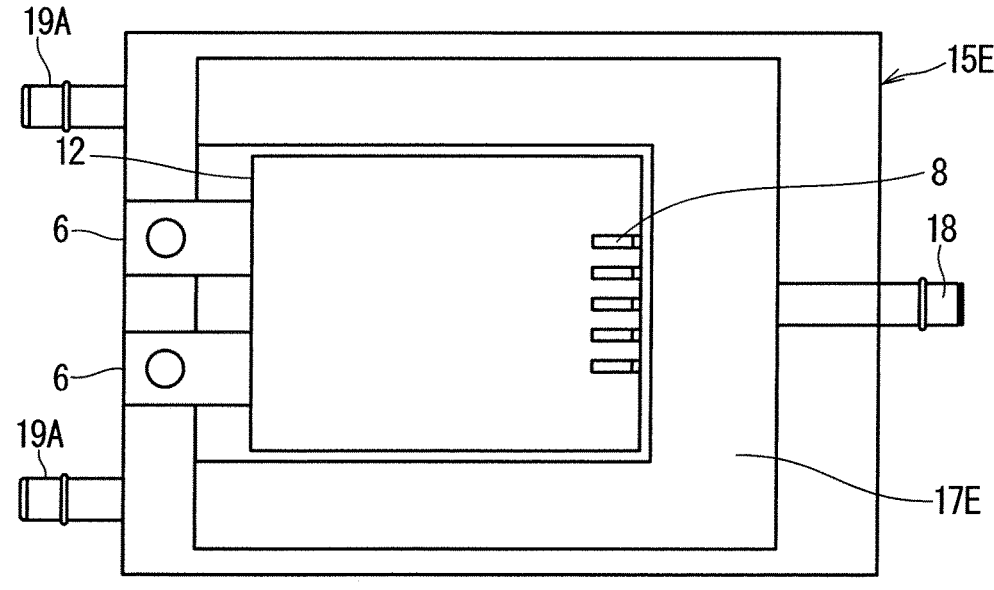
FIG. 25 is a plan view schematically showing an example of a configuration of a semiconductor device according to an embodiment.

As shown with an example in FIGS. 23, 24, and 25, the semiconductor device includes a resin package module 12 and a cooler 15E that cools the resin package module 12 by water cooling.

The cooler 15E formed of aluminum or the like is disposed in contact with a lower surface of the resin package module 12, specifically, a lower surface of the metal plate 10 while surrounding the resin package module 12 in a plan view.

The cooler 15E includes: a metal base 16 formed of copper or the like in contact with a lower surface of the metal plate 10 with interposition of the heat dissipating grease 13; a cooling pipe 17E disposed on an upper surface of the metal base 16, the cooling pipe 17E being formed of aluminum or the like disposed to partially surround the resin package module 12 in a plan view; a cooling water introduction nipple 18 configured to introduce the cooling water 22 into the cooling pipe 17E; and two cooling water drainage nipples 19A configured to discharge the cooling water 22 from the cooling pipe 17E.

The cooling water introduction nipple 18 is provided in a linear portion of the cooling pipe 17E partially surrounding the resin package module 12 in a plan view. In addition, the two cooling water drainage nipples 19A are provided at both ends of the cooling pipe 17E partially surrounding the resin package module 12 in a plan view.

Here, in the cooling pipe 17E, an inner side surface surrounding the resin package module 12 is in contact with a side surface of the resin package module 12 with interposition of heat dissipating grease 13 (not shown) or the like.

It should be noted that when contact of the inner side surface of the cooling pipe 17E with the side surface of the resin package module 12 makes it difficult to secure the circular surface distance and the space distance of the signal terminal 8 protruding from the side surface of the resin package module 12, these terminals may be changed to protrude from the upper surface of the resin package module 12.

In the lead forming of the signal terminal 8 in this case, the signal terminal 8 is formed so as to be exposed at a corner portion of the upper surface of the molding resin 11 and to extend along the upper surface so as to be flush with the upper surface of the molding resin 11. Then, the signal terminal 8 is formed so as to extend from the corner portion of the upper surface of the molding resin 11 toward the upper side of the molding resin 11 so as to be flush with the side surface of molding resin 11.

Figure 26:
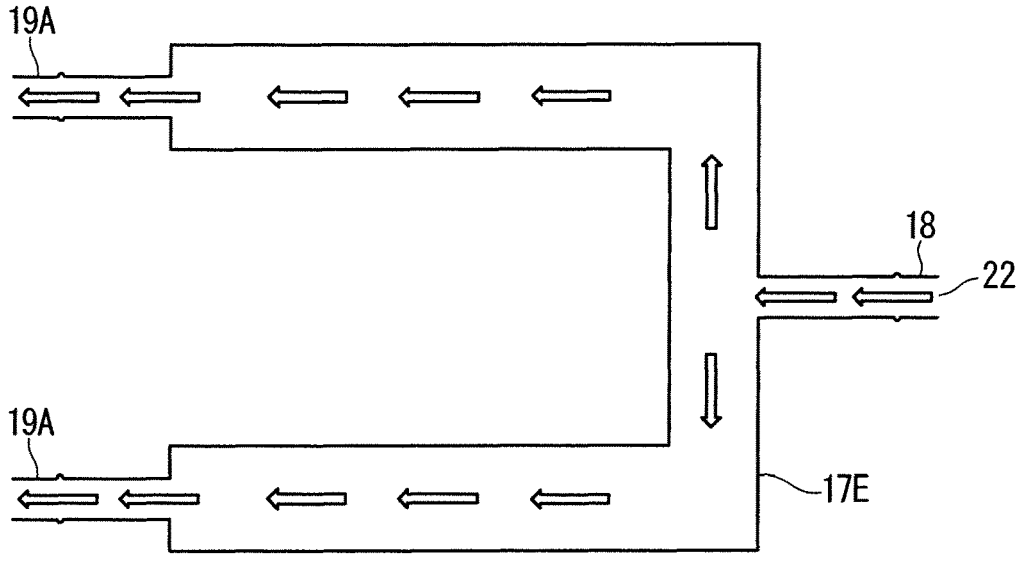
FIG. 26 is a view schematically showing a flow of circulation of cooling water in a cooler.

FIG. 26 is a view schematically showing a flow of circulation of cooling water 22 in the cooler 15E. As shown with an example in FIG. 26, the cooler 15E circulates cooling water 22 through the cooling pipe 17E. Accordingly, the cooler 15E cools the resin package module 12 through the metal base 16.

Specifically, the cooler 15E dissipates heat generated from the semiconductor element 3 and heat generated from the semiconductor element 4, which are transferred through the metal block 1, the insulating material 9, the metal plate 10, and the heat dissipating grease 13 in the resin package module 12, by cooling water 22 circulating in the cooling pipe 17E through the metal base 16.

In addition, the cooler 15E cools the heat generated from the semiconductor element 3 and the heat generated from the semiconductor element 4 transferred through the metal block 1 and the molding resin 11 in the resin package module 12 by the cooling water 22 circulating in the cooling pipe 17E through the inner side surface in contact with the resin package module 12.

According to the above configuration, since the cooling pipe 17E of the cooler 15E is disposed to partially surround the resin package module 12 in a plan view, the height of the entire structure of the semiconductor device can be kept low. In addition, since the cooler 15E cools the heat generated from the semiconductor element 3 and the heat generated from the semiconductor element 4 through the inner side surface in contact with the resin package module 12, the cooling efficiency is improved. In addition, with the configuration in which the signal terminal 8 protrudes from the upper surface of the molding resin 11, the allowable range of the voltage applied to the semiconductor element 3 and the semiconductor element 4 is extended, so that the quality of the semiconductor device is improved. In addition, since the cooling pipe 17E is disposed without surrounding the entire periphery of the resin package module 12 in a plan view, the occupied area (foot space) of the semiconductor device can be reduced.

Seventh Embodiment

A semiconductor device according to the present embodiment will be described. It should be noted that in the following description, the same components as those described in the embodiment described above are denoted by the same reference numerals and illustrated, and the detailed description thereof will be appropriately omitted.
<Configuration of Semiconductor Device>

Figure 27:
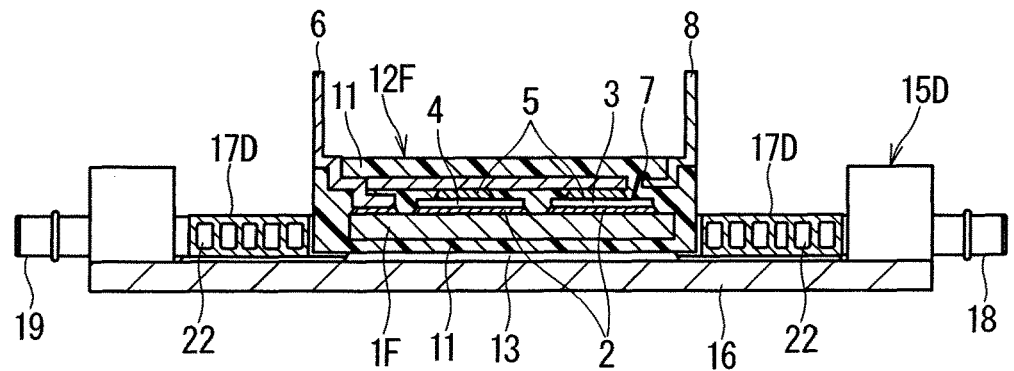
FIG. 27 is a cross-sectional view schematically showing an example of a configuration of a semiconductor device according to an embodiment.
Figure 28:
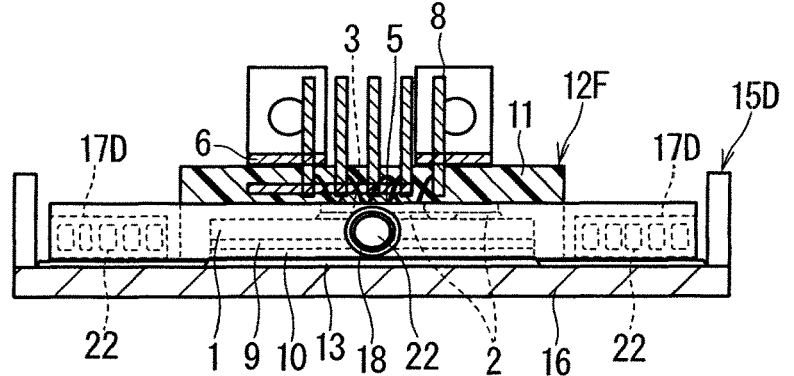
FIG. 28 is a cross-sectional view from another direction schematically showing an example of a configuration of a semiconductor device according to an embodiment.

FIG. 27 is a cross-sectional view schematically showing an example of the configuration of the semiconductor device according to the present embodiment. In addition, FIG. 28 is a cross-sectional view from another direction schematically showing an example of a configuration of a semiconductor device according to the present embodiment. In addition, FIG. 29 is a plan view schematically showing an example of the configuration of the semiconductor device according to the present embodiment.

As shown with an example in FIGS. 27, 28, and 29, the semiconductor device includes a resin package module 12F and a cooler 15D that cools the resin package module 12F by water cooling.

The resin package module 12F includes: a metal block 1F formed of copper or the like; a semiconductor element 3 including silicon (Si) or the like joined to an upper surface of the metal block 1F with interposition of a brazing material 2 such as solder; a semiconductor element 4 including silicon (Si) or the like joined to an upper surface of the metal block 1F with interposition of a brazing material 2 such as solder; a main terminal 6 formed of copper or the like joined to an upper surface of the semiconductor element 3 and an upper surface of the semiconductor element 4 with interposition of a brazing material 5 such as solder; a signal terminal 8 formed of copper or the like connected to the semiconductor element 3 with interposition of a wire bond 7 formed of aluminum or the like; and a molding resin 11 formed by sealing the above-described configuration while exposing a part of the main terminal 6 and a part of the signal terminal 8. In addition, the lower surface of the metal block IF is covered with the molding resin 11.

The cooler 15D formed of aluminum or the like is disposed in contact with a lower surface of the resin package module 12F, specifically, a lower surface of the molding resin 11 while surrounding the resin package module 12F in a plan view.

The cooler 15D includes: a metal base 16 formed of copper or the like in contact with a lower surface of the molding resin 11 with interposition of the heat dissipating grease 13; a cooling pipe 17D disposed on an upper surface of the metal base 16, the cooling pipe 17D being formed of aluminum or the like disposed to surround the entire periphery of the resin package module 12F in a plan view; a cooling water introduction nipple 18 configured to introduce the cooling water 22 into the cooling pipe 17D; and a cooling water drainage nipple 19 configured to discharge the cooling water 22 from the cooling pipe 17D.

Here, in the cooling pipe 17D, an inner side surface surrounding the resin package module 12F is in contact with a side surface of the resin package module 12F with interposition of heat dissipating grease 13 (not shown) or the like.

It should be noted that in the present embodiment, the cooler 15D is provided as a cooler for cooling the resin package module 12F, but the cooler 15 and the like shown in other embodiments may be provided instead.

FIG. 30 is a view schematically showing a flow of circulation of cooling water 22 in the cooler 15D. As shown with an example in FIG. 30, the cooler 15D circulates cooling water 22 through the cooling pipe 17D. Accordingly, the cooler 15D cools the resin package module 12F through the metal base 16.

Specifically, the cooler 15D dissipates heat generated from the semiconductor element 3 and heat generated from the semiconductor element 4, which are transferred through the metal block 1F and the heat dissipating grease 13 in the resin package module 12F, by cooling water 22 circulating in the cooling pipe 17D through the metal base 16.

In addition, the cooler 15D cools the heat generated from the semiconductor element 3 and the heat generated from the semiconductor element 4 transferred through the metal block 1F and the molding resin 11 in the resin package module 12F by the cooling water 22 circulating in the cooling pipe 17D through the inner side surface in contact with the resin package module 12F.

According to the above configuration, since the cooling pipe 17D of the cooler 15D is disposed to surround the resin package module 12F in a plan view, the height of the entire structure of the semiconductor device can be kept low. In addition, since the cooler 15D cools the heat generated from the semiconductor element 3 and the heat generated from the semiconductor element 4 through the inner side surface in contact with the resin package module 12F, the cooling efficiency is improved. In addition, since the resin package module 12F has a sufficient withstand voltage due to the lower surface of the metal block 1F being covered with the molding resin 11, it is not necessary for the resin package module 12F to separately include an insulating material. Therefore, it is possible to improve the assembling property of the semiconductor device and to suppress the manufacturing cost.

Eighth Embodiment

A semiconductor device according to the present embodiment will be described. It should be noted that in the following description, the same components as those described in the embodiment described above are denoted by the same reference numerals and illustrated, and the detailed description thereof will be appropriately omitted.
<Configuration of Semiconductor Device>

Figure 32:
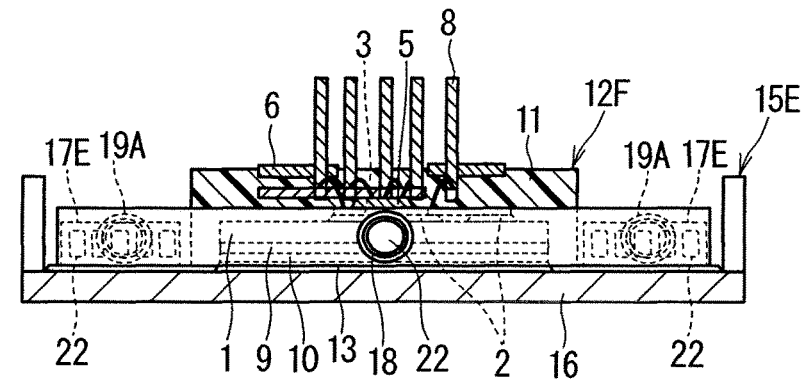
FIG. 32 is a cross-sectional view from another direction schematically showing an example of a configuration of a semiconductor device according to an embodiment.

FIG. 31 is a cross-sectional view schematically showing an example of the configuration of the semiconductor device according to the present embodiment. In addition, FIG. 32 is a cross-sectional view from another direction schematically showing an example of a configuration of a semiconductor device according to the present embodiment. In addition, FIG. 33 is a plan view schematically showing an example of the configuration of the semiconductor device according to the present embodiment.

Figure 33:
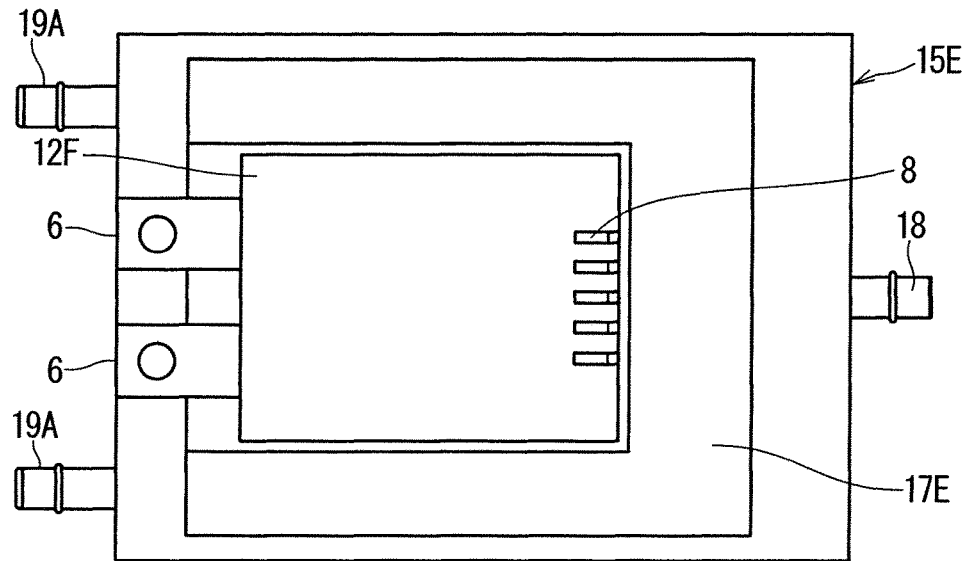
FIG. 33 is a plan view schematically showing an example of a configuration of a semiconductor device according to an embodiment.

As shown with an example in FIGS. 31, 32, and 33, the semiconductor device includes a resin package module 12F and a cooler 15E that cools the resin package module 12F by water cooling.

The resin package module 12F includes a metal block 1F, a semiconductor element 3, a semiconductor element 4, a main terminal 6, a signal terminal 8, and a molding resin 11.

The cooler 15E is disposed in contact with a lower surface of the resin package module 12F, specifically, a lower surface of the molding resin 11 while surrounding the resin package module 12F in a plan view.

The cooler 15E includes a metal base 16, a cooling pipe 17E, a cooling water introduction nipple 18, and two cooling water drainage nipples 19A.

The cooling water introduction nipple 18 is provided in a linear portion of the cooling pipe 17E partially surrounding the resin package module 12F in a plan view. In addition, the two cooling water drainage nipples 19A are provided at both ends of the cooling pipe 17E partially surrounding the resin package module 12F in a plan view.

Here, in the cooling pipe 17E, an inner side surface surrounding the resin package module 12F is in contact with a side surface of the resin package module 12F with interposition of heat dissipating grease 13 (not shown) or the like.

It should be noted that in the present embodiment, the cooler 15E is provided as a cooler for cooling the resin package module 12F, but the cooler 15A and the like shown in other embodiments may be provided instead.

Figure 34:
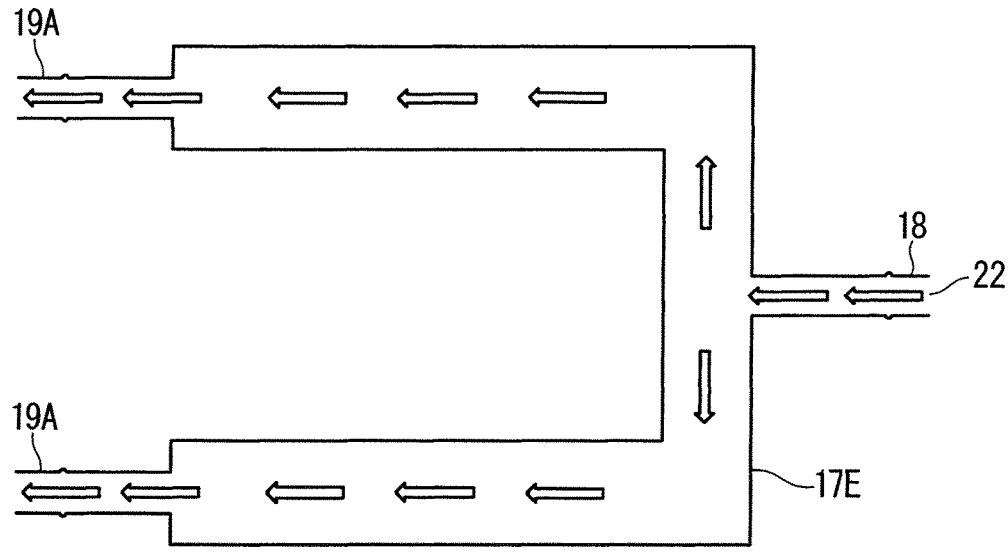
FIG. 34 is a view schematically showing a flow of circulation of cooling water in a cooler.

FIG. 34 is a view schematically showing a flow of circulation of cooling water 22 in the cooler 15E. As shown with an example in FIG. 34, the cooler 15E circulates cooling water 22 through the cooling pipe 17E. Accordingly, the cooler 15E cools the resin package module 12F through the metal base 16.

Specifically, the cooler 15E dissipates heat generated from the semiconductor element 3 and heat generated from the semiconductor element 4, which are transferred through the metal block 1 and the heat dissipating grease 13 in the resin package module 12F, by cooling water 22 circulating in the cooling pipe 17E through the metal base 16.

In addition, the cooler 15E cools the heat generated from the semiconductor element 3 and the heat generated from the semiconductor element 4 transferred through the metal block 1 and the molding resin 11 in the resin package module 12F by the cooling water 22 circulating in the cooling pipe 17E through the inner side surface in contact with the resin package module 12F.

According to the above configuration, since the cooling pipe 17E of the cooler 15E is disposed to partially surround the resin package module 12F in a plan view, the height of the entire structure of the semiconductor device can be kept low. In addition, since the cooler 15E cools the heat generated from the semiconductor element 3 and the heat generated from the semiconductor element 4 through the inner side surface in contact with the resin package module 12F, the cooling efficiency is improved. In addition, since the resin package module 12F has a sufficient withstand voltage due to the lower surface of the metal block 1F being covered with the molding resin 11, it is not necessary for the resin package module 12F to separately include an insulating material. Therefore, it is possible to improve the assembling property of the semiconductor device and to suppress the manufacturing cost.

Ninth Embodiment

A semiconductor device according to the present embodiment will be described. It should be noted that in the following description, the same components as those described in the embodiment described above are denoted by the same reference numerals and illustrated, and the detailed description thereof will be appropriately omitted.
<Configuration of Semiconductor Device>

Figure 35:
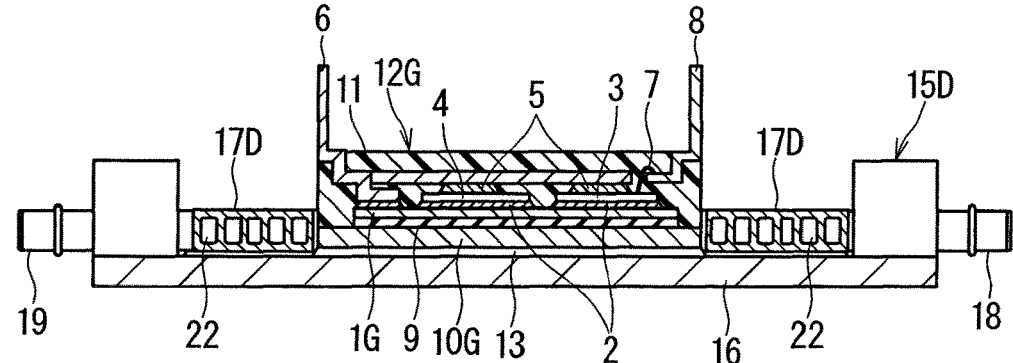
FIG. 35 is a cross-sectional view schematically showing an example of a configuration of a semiconductor device according to an embodiment.
Figure 36:
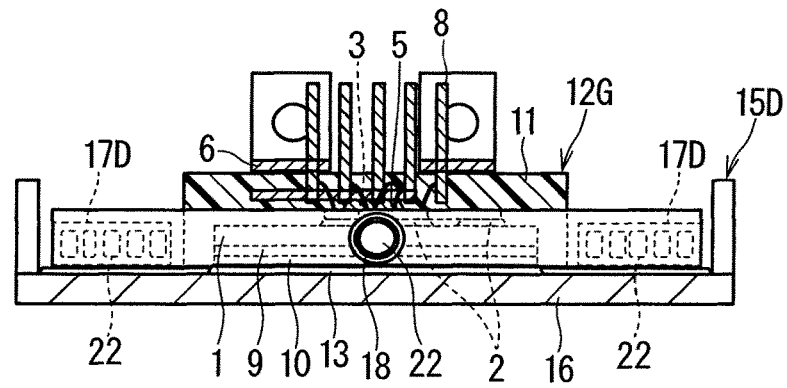
FIG. 36 is a cross-sectional view from another direction schematically showing an example of a configuration of a semiconductor device according to an embodiment.

FIG. 35 is a cross-sectional view schematically showing an example of the configuration of the semiconductor device according to the present embodiment. In addition, FIG. 36 is a cross-sectional view from another direction schematically showing an example of a configuration of a semiconductor device according to the present embodiment. In addition, FIG. 37 is a plan view schematically showing an example of the configuration of the semiconductor device according to the present embodiment.

Figure 37:
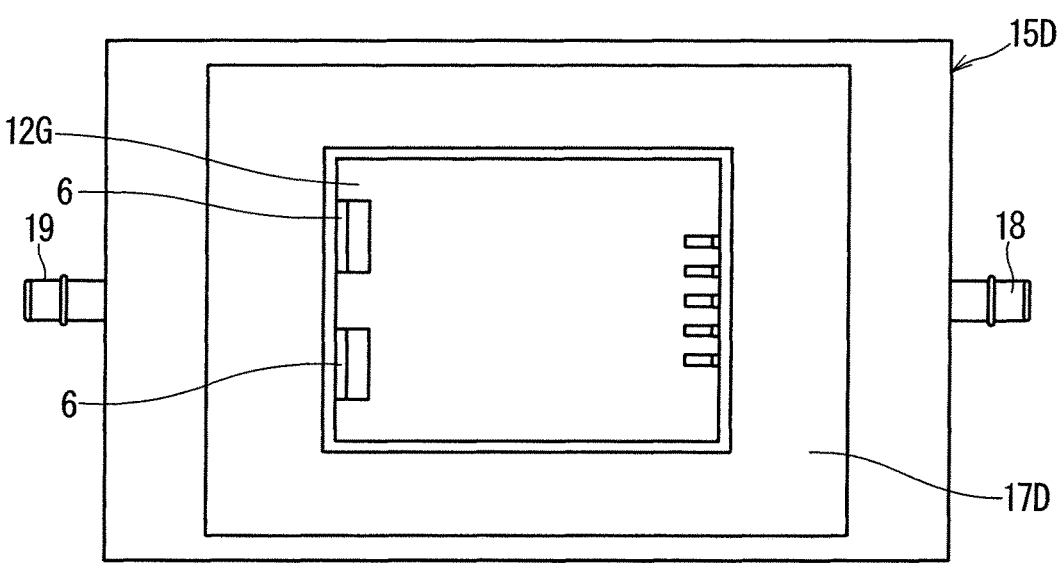
FIG. 37 is a plan view schematically showing an example of a configuration of a semiconductor device according to an embodiment.

As shown with an example in FIGS. 35, 36, and 37, the semiconductor device includes a resin package module 12G and a cooler 15D that cools the resin package module 12G by water cooling.

The resin package module 12G includes: a metal block 1G formed of copper or the like; a semiconductor element 3 including silicon (Si) or the like joined to an upper surface of the metal block 1G with interposition of a brazing material 2 such as solder; a semiconductor element 4 including silicon (Si) or the like joined to an upper surface of the metal block 1G with interposition of a brazing material 2 such as solder; a main terminal 6 formed of copper or the like joined to an upper surface of the semiconductor element 3 and an upper surface of the semiconductor element 4 with interposition of a brazing material 5 such as solder; a signal terminal 8 formed of copper or the like connected to the semiconductor element 3 with interposition of a wire bond 7 formed of aluminum or the like; an insulating material 9 formed of an epoxy resin, ceramic, or the like provided on a lower surface of the metal block 1G; a metal plate 10G formed of copper or the like provided on a lower surface of the insulating material 9; and a molding resin 11 formed by sealing the above-described configuration while exposing a part of the main terminal 6, a part of the signal terminal 8, and the side surface and the lower surface of the metal plate 10G.

The cooler 15D formed of aluminum or the like is disposed in contact with a lower surface of the resin package module 12G, specifically, a lower surface of the metal plate 10G while surrounding the resin package module 12G in a plan view.

The cooler 15D includes: a metal base 16 formed of copper or the like in contact with a lower surface of the metal plate 10G with interposition of the heat dissipating grease 13; a cooling pipe 17D disposed on an upper surface of the metal base 16, the cooling pipe 17D being formed of aluminum or the like disposed to surround the entire periphery of the resin package module 12G in a plan view; a cooling water introduction nipple 18 configured to introduce the cooling water 22 into the cooling pipe 17D; and a cooling water drainage nipple 19 configured to discharge the cooling water 22 from the cooling pipe 17D.

Here, in the cooling pipe 17D, an inner side surface surrounding the resin package module 12G is in contact with a side surface of the metal plate 10G with interposition of heat dissipating grease 13 (not shown) or the like.

Figure 38:
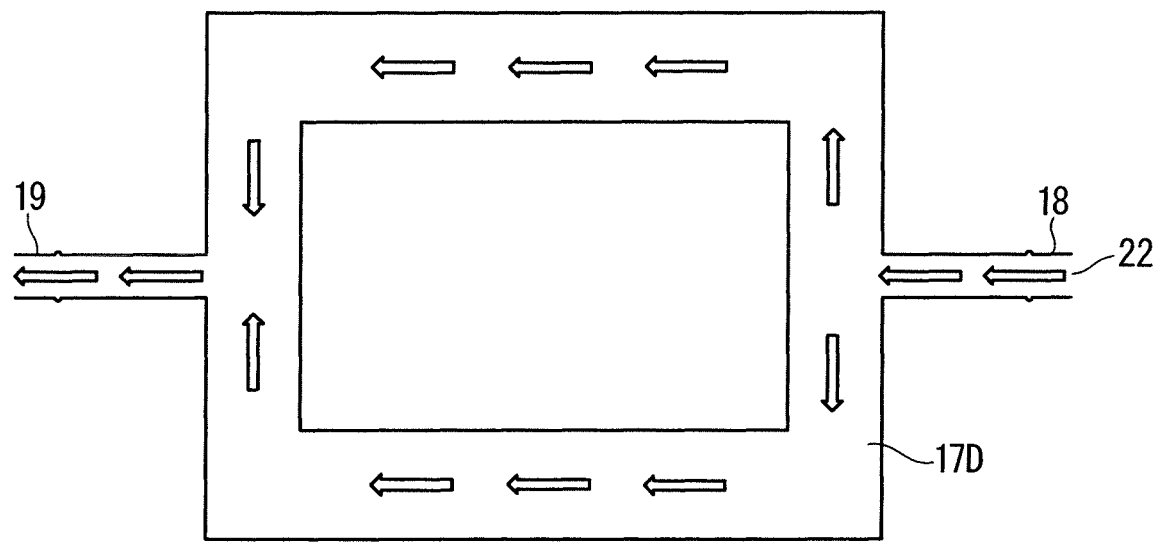
FIG. 38 is a view schematically showing a flow of circulation of cooling water in a cooler.

FIG. 38 is a view schematically showing a flow of circulation of cooling water 22 in the cooler 15D. As shown with an example in FIG. 38, the cooler 15D circulates cooling water 22 through the cooling pipe 17D. Accordingly, the cooler 15D cools the resin package module 12G through the metal base 16.

Specifically, the cooler 15D dissipates heat generated from the semiconductor element 3 and heat generated from the semiconductor element 4, which are transferred through the metal block 1G, the insulating material 9, the metal plate 10G, and the heat dissipating grease 13 in the resin package module 12G, by cooling water 22 circulating in the cooling pipe 17D through the metal base 16.

In addition, the cooler 15D cools the heat generated from the semiconductor element 3 and the heat generated from the semiconductor element 4 transferred through the metal block 1G, the insulating material 9, and the metal plate 10G in the resin package module 12G by the cooling water 22 circulating in the cooling pipe 17D through the inner side surface in contact with the resin package module 12G.

According to the above configuration, since the cooling pipe 17D of the cooler 15D is disposed to surround the resin package module 12G in a plan view, the height of the entire structure of the semiconductor device can be kept low. In addition, since the cooler 15D cools the heat generated from the semiconductor element 3 and the heat generated from the semiconductor element 4 through the inner side surface in contact with the side surface of the metal plate 10G of the resin package module 12G, the cooling efficiency is improved.

Tenth Embodiment

A semiconductor device according to the present embodiment will be described. It should be noted that in the following description, the same components as those described in the embodiment described above are denoted by the same reference numerals and illustrated, and the detailed description thereof will be appropriately omitted.

<Configuration of Semiconductor Device>

Figure 39:
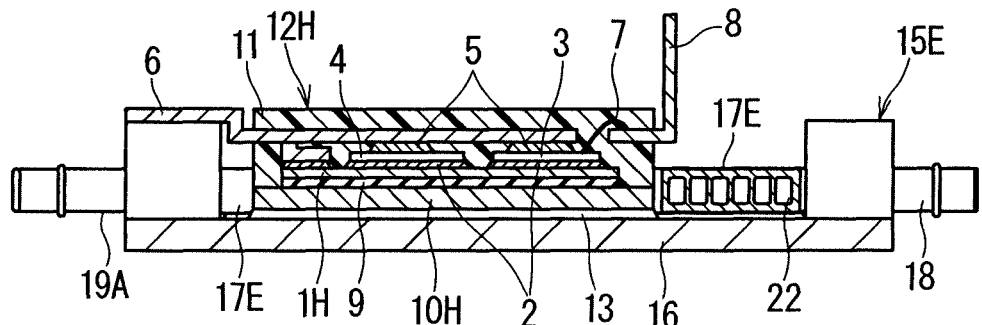
FIG. 39 is a cross-sectional view schematically showing an example of a configuration of a semiconductor device according to an embodiment.
Figure 40:
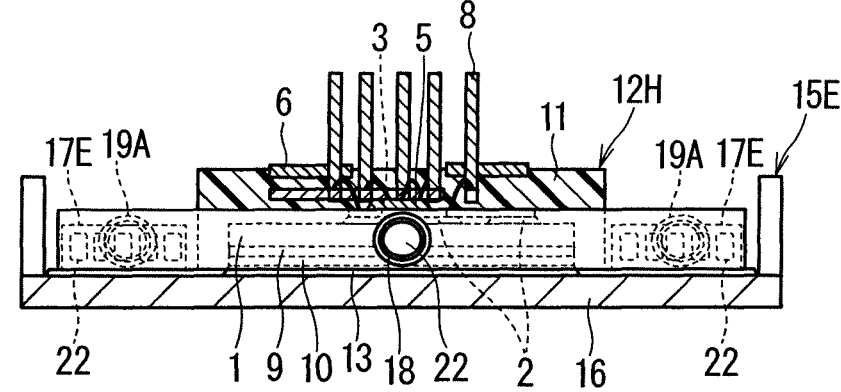
FIG. 40 is a cross-sectional view from another direction schematically showing an example of a configuration of a semiconductor device according to an embodiment.

FIG. 39 is a cross-sectional view schematically showing an example of the configuration of the semiconductor device according to the present embodiment. In addition, FIG. 40 is a cross-sectional view from another direction schematically showing an example of a configuration of a semiconductor device according to the present embodiment. In addition, FIG. 41 is a plan view schematically showing an example of the configuration of the semiconductor device according to the present embodiment.

Figure 41:
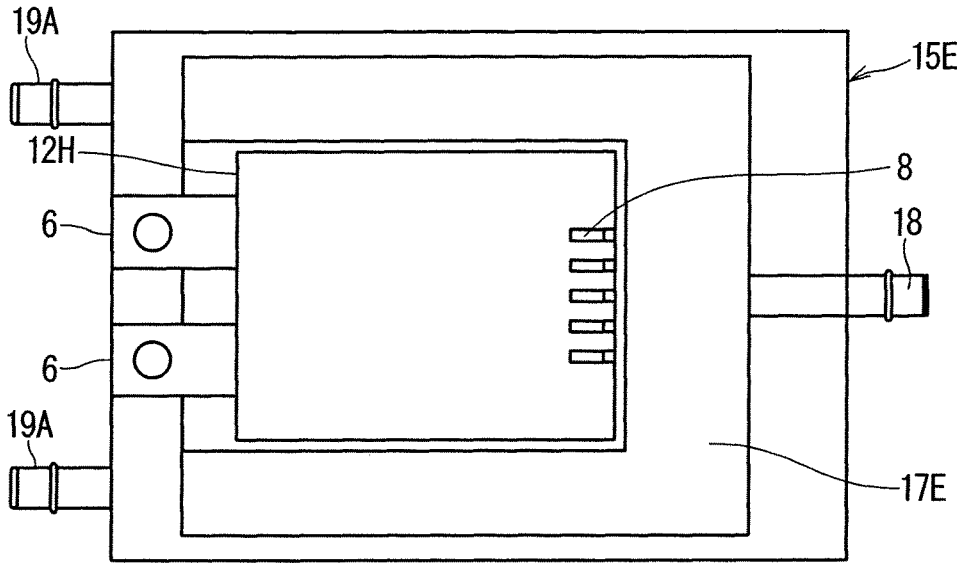
FIG. 41 is a plan view schematically showing an example of a configuration of a semiconductor device according to an embodiment.

As shown with an example in FIGS. 39, 40, and 41, the semiconductor device includes a resin package module 12H and a cooler 15E that cools the resin package module 12H by water cooling.

The resin package module 12H includes: a metal block 1H formed of copper or the like; a semiconductor element 3 including silicon (Si) or the like joined to an upper surface of the metal block 1H with interposition of a brazing material 2 such as solder; a semiconductor element 4 including silicon (Si) or the like joined to an upper surface of the metal block 1H with interposition of a brazing material 2 such as solder; a main terminal 6 formed of copper or the like joined to an upper surface of the semiconductor element 3 and an upper surface of the semiconductor element 4 with interposition of a brazing material 5 such as solder; a signal terminal 8 formed of copper or the like connected to the semiconductor element 3 with interposition of a wire bond 7 formed of aluminum or the like; an insulating material 9 formed of an epoxy resin, ceramic, or the like provided on a lower surface of the metal block 1H; a metal plate 10H formed of copper or the like provided on a lower surface of the insulating material 9; and a molding resin 11 formed by sealing the above-described configuration while exposing a part of the main terminal 6, a part of the signal terminal 8, and a part of the side surface (that is, the side surface facing the cooling pipe 17E of the cooler 15E) and the lower surface of the metal plate 10H.

The cooler 15E is disposed in contact with a lower surface of the resin package module 12H, specifically, a lower surface of the metal plate 10H while surrounding the resin package module 12H in a plan view.

The cooler 15E includes a metal base 16 formed of copper or the like in contact with the lower surface of the metal plate 10H with interposition of the heat dissipating grease 13, a cooling pipe 17E, a cooling water introduction nipple 18, and two cooling water drainage nipples 19A.

The cooling water introduction nipple 18 is provided in a linear portion of the cooling pipe 17E partially surrounding the resin package module 12H in a plan view. In addition, the two cooling water drainage nipples 19A are provided at both ends of the cooling pipe 17E partially surrounding the resin package module 12H in a plan view.

Here, in the cooling pipe 17E, an inner side surface surrounding the resin package module 12H is in contact with a side surface of the metal plate 10H with interposition of heat dissipating grease 13 (not shown) or the like.

Figure 42:
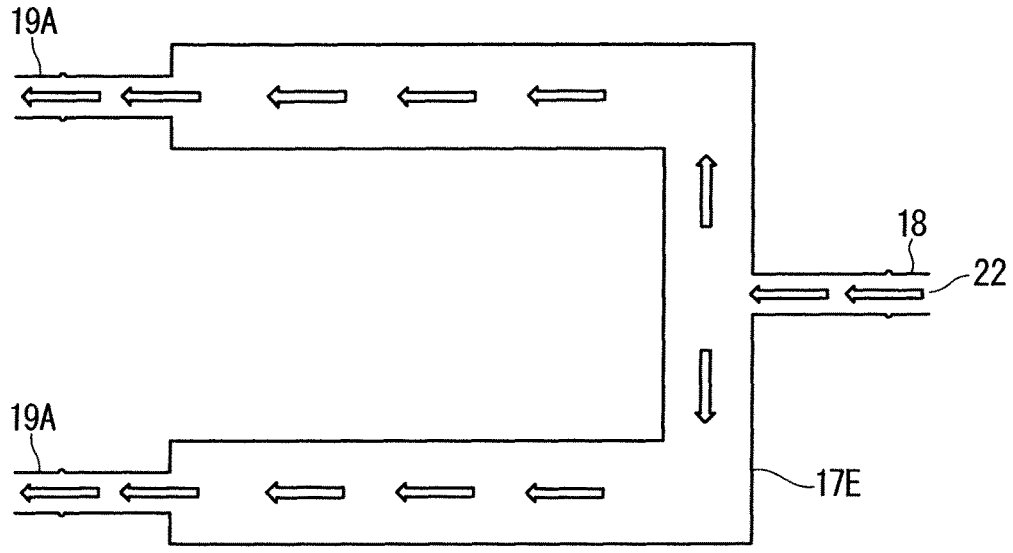
FIG. 42 is a view schematically showing a flow of circulation of cooling water in a cooler.

FIG. 42 is a view schematically showing a flow of circulation of cooling water 22 in the cooler 15E. As shown with an example in FIG. 42, the cooler 15E circulates cooling water 22 through the cooling pipe 17E. Accordingly, the cooler 15E cools the resin package module 12H through the metal base 16.

Specifically, the cooler 15E dissipates heat generated from the semiconductor element 3 and heat generated from the semiconductor element 4, which are transferred through the metal block 1H, the insulating material 9, the metal plate 10H, and the heat dissipating grease 13 in the resin package module 12H, by cooling water 22 circulating in the cooling pipe 17E through the metal base 16.

In addition, the cooler 15E cools the heat generated from the semiconductor element 3 and the heat generated from the semiconductor element 4 transferred through the metal block 1H, the insulating material 9, and the metal plate 10H in the resin package module 12H by the cooling water 22 circulating in the cooling pipe 17E through the inner side surface in contact with the resin package module 12H.

According to the above configuration, since the cooling pipe 17E of the cooler 15E is disposed to partially surround the resin package module 12H in a plan view, the height of the entire structure of the semiconductor device can be kept low. In addition, since the cooler 15E cools the heat generated from the semiconductor element 3 and the heat generated from the semiconductor element 4 through the inner side surface in contact with the side surface of the metal plate 10H of the resin package module 12H, the cooling efficiency is improved. In addition, since the cooling pipe 17E is disposed without surrounding the entire periphery of the resin package module 12H in a plan view, the occupied area (foot space) of the semiconductor device can be reduced.

Eleventh Embodiment

A semiconductor device according to the present embodiment will be described. It should be noted that in the following description, the same components as those described in the embodiment described above are denoted by the same reference numerals and illustrated, and the detailed description thereof will be appropriately omitted.
<Configuration of Semiconductor Device>

Figure 43:
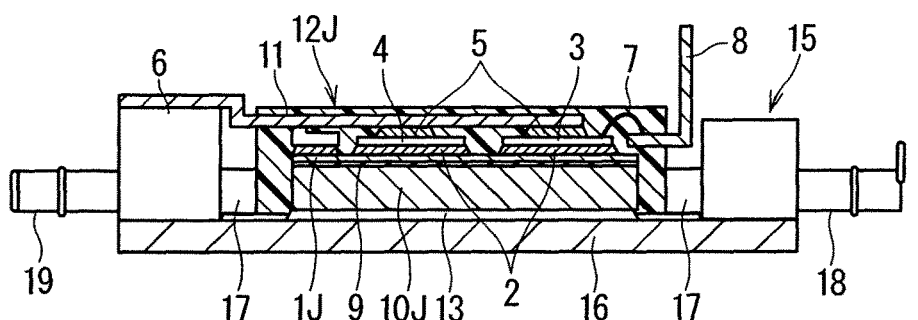
FIG. 43 is a cross-sectional view schematically showing an example of a configuration of a semiconductor device according to an embodiment.
Figure 44:
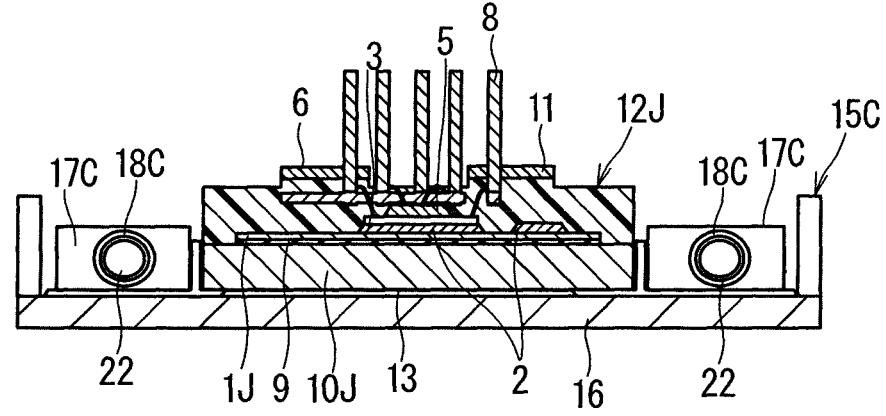
FIG. 44 is a cross-sectional view from another direction schematically showing an example of a configuration of a semiconductor device according to an embodiment.

FIG. 43 is a cross-sectional view schematically showing an example of the configuration of the semiconductor device according to the present embodiment. In addition, FIG. 44 is a cross-sectional view from another direction schematically showing an example of a configuration of a semiconductor device according to the present embodiment. In addition, FIG. 45 is a plan view schematically showing an example of the configuration of the semiconductor device according to the present embodiment.

Figure 45:
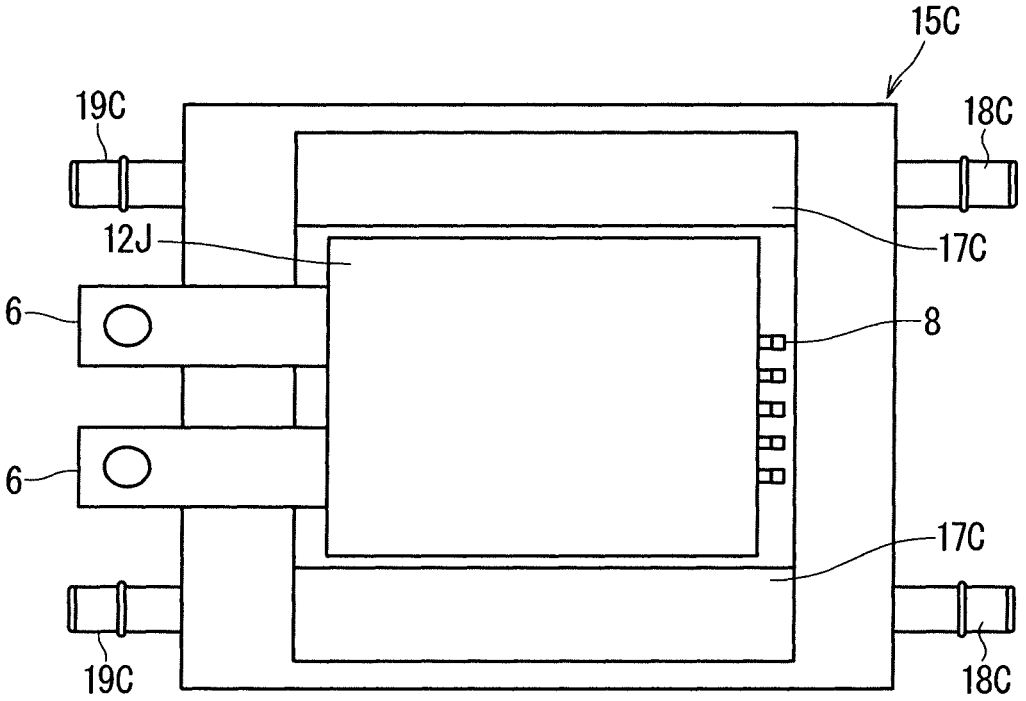
FIG. 45 is a plan view schematically showing an example of a configuration of a semiconductor device according to an embodiment.

As shown with an example in FIGS. 43, 44, and 45, the semiconductor device includes a resin package module 12J and a cooler 15C that cools the resin package module 12J by water cooling.

The resin package module 12J includes: a metal block 1J formed of copper or the like; a semiconductor element 3 including silicon (Si) or the like joined to an upper surface of the metal block 1J with interposition of a brazing material 2 such as solder; a semiconductor element 4 including silicon (Si) or the like joined to an upper surface of the metal block 1J with interposition of a brazing material 2 such as solder; a main terminal 6 formed of copper or the like joined to an upper surface of the semiconductor element 3 and an upper surface of the semiconductor element 4 with interposition of a brazing material 5 such as solder; a signal terminal 8 formed of copper or the like connected to the semiconductor element 3 with interposition of a wire bond 7 formed of aluminum or the like; an insulating material 9 formed of an epoxy resin, ceramic, or the like provided on a lower surface of the metal block 1J; a metal plate 10J formed of copper or the like provided on a lower surface of the insulating material 9; and a molding resin 11 formed by sealing the above-described configuration while exposing a part of the main terminal 6, a part of the signal terminal 8, and a part of the side surface (that is, the side surface facing the cooling pipe 17C of the cooler 15C) and the lower surface of the metal plate 10J. Here, each of the main terminal 6 and the signal terminal 8 protrudes from the side surface of the molding resin 11.

The cooler 15C formed of aluminum or the like is disposed in contact with a lower surface of the resin package module 12J, specifically, a lower surface of the metal plate 10J while surrounding the resin package module 12J in a plan view.

The cooler 15C includes: a metal base 16 formed of copper or the like in contact with a lower surface of the metal plate 10J with interposition of the heat dissipating grease 13; a cooling pipe 17C disposed on an upper surface of the metal base 16, the cooling pipe 17C being formed of aluminum or the like disposed to partially surround the resin package module 12J in a plan view; a cooling water introduction nipple 18C configured to introduce the cooling water 22 into the cooling pipe 17C; and a cooling water drainage nipple 19C configured to discharge the cooling water 22 from the cooling pipe 17C.

FIG. 46 is a view schematically showing a flow of circulation of cooling water 22 in the cooler 15C. As shown with an example in FIG. 46, the cooler 15C circulates cooling water 22 through the cooling pipe 17C. Accordingly, the cooler 15C cools the resin package module 12J through the metal base 16.

Specifically, the cooler 15C dissipates heat generated from the semiconductor element 3 and heat generated from the semiconductor element 4, which are transferred through the metal block 1, the insulating material 9, the metal plate 10J, and the heat dissipating grease 13 in the resin package module 12J, by cooling water 22 circulating in the cooling pipe 17C through the metal base 16.

In addition, the cooler 15C cools the heat generated from the semiconductor element 3 and the heat generated from the semiconductor element 4 transferred through the metal block 1J, the insulating material 9, and the metal plate 10J in the resin package module 12J by the cooling water 22 circulating in the cooling pipe 17C through the inner side surface in contact with the resin package module 12J.

According to the above configuration, since the cooling pipe 17C of the cooler 15C is disposed to surround only a pair of facing side surfaces of the resin package module 12J in a plan view, the height of the entire structure of the semiconductor device can be kept low. In addition, since the cooling pipe 17C is disposed without surrounding the entire periphery of the resin package module 12J in a plan view, the occupied area (foot space) of the semiconductor device can be reduced.

Effects Produced by Embodiments Described Above

Next, examples of effects produced by the above-described embodiments will be shown. It should be noted that in the following description, the effects are described based on the specific configuration exemplified in the above-described embodiments, but in the scope where the same effects are produced, the configuration may be replaced with other specific configurations exemplified in the specification of the present application.

In addition, the replacement may be performed across a plurality of embodiments. That is, the case may be used where the same effects are produced by combining the respective configurations exemplified in different embodiments.

According to the embodiments described above, the semiconductor device includes the semiconductor module and the cooler 15 that cools the semiconductor module. Here, the semiconductor module corresponds to, for example, any one of the resin package module 12, the resin package module 12F, the resin package module 12G, the resin package module 12H, the resin package module 12J, and the like (hereinafter, for convenience, any one of these may be described in a corresponding manner.). The resin package module 12 includes a metal block 1 (alternatively, a metal block 1F, a metal block 1G, a metal block 1H, or a metal block 1J), a semiconductor element 3 (or a semiconductor element 4) provided on an upper surface of the metal block 1, a terminal connected to the semiconductor element 3, and a resin covering a part of the terminal, the metal block 1, and the semiconductor element 3. Here, the terminal corresponds to, for example, any one of the main terminal 6, the signal terminal 8, and the like (hereinafter, for convenience, any one of these may be correspondingly described). In addition, the resin corresponds to, for example, the molding resin 11. The cooler 15 includes a metal base 16 and a cooling pipe 17 (alternatively, a cooling pipe 17A, a cooling pipe 17B, a cooling pipe 17C, a cooling pipe 17D, or a cooling pipe 17E). The metal base 16 is in contact with the lower surface of the resin package module 12. In addition, the metal base 16 is provided in a region larger than a region overlapping the resin package module 12 in a plan view. The cooling pipe 17 is disposed on the upper surface of the metal base 16. In addition, the cooling pipe 17 circulates a refrigerant for cooling the resin package module 12. Here, the refrigerant corresponds to, for example, the cooling water 22. Then, the cooling pipe 17 is provided to surround at least a part of the resin package module 12 in a plan view.

According to the configuration, since the cooling pipe 17 of the cooler 15 is disposed to surround the resin package module 12 in a plan view, the height of the entire structure of the semiconductor device can be kept low. Specifically, since dissipating heat generated from the semiconductor element 3 and the semiconductor element 4 in the resin package module 12 to the lower surface of the cooling pipe 17 through the metal block 1, the insulating material 9, the metal plate 10, the heat dissipating grease 13, and the metal base 16 in the resin package module 12 makes it not necessary to dispose the cooling pipe below the resin package module 12, the height of the entire structure of the semiconductor device can be kept low. When priority is given to securing a foot space and improving cooling capacity, the cooling pipe is disposed below the resin package module, which has been a factor in increase in the height of the entire structure of the semiconductor device. However, due to diversification of installation places of the semiconductor device, relaxation (increase) of the maximum operating temperature due to the wide band gap semiconductor, or the like, it has been sometimes required to keep the height of the entire structure of the semiconductor device low even at the cost of some foot space or cooling capacity. According to the above configuration, such a request can be responded.

It should be noted that even when another configuration exemplified in the specification of the present application is appropriately added to the above configuration, that is, even when another configuration in the specification of the present application not referred to as the above configuration is appropriately added, a similar effect can be produced.

In addition, according to the embodiment described above, the lower surface of the metal block 1F is covered with the molding resin 11. Then, the metal base 16 is in contact with the lower surface of the molding resin 11. According to the configuration, since the resin package module 12F has a sufficient withstand voltage due to the lower surface of the metal block 1F being covered with the molding resin 11, it is not necessary for the resin package module 12F to separately include an insulating material. Therefore, it is possible to improve the assembling property of the semiconductor device and to suppress the manufacturing cost.

In addition, according to the embodiment described above, the resin package module 12 includes the insulating material 9 provided on the lower surface of the metal block 1 and the metal plate 10 provided on the lower surface of the insulating material 9.

Then, the lower surface of the metal plate 10 is exposed from the molding resin 11. In addition, the metal base 16 is in contact with the lower surface of the metal plate 10. According to the configuration, since the upper surface of the metal base 16 and the lower surface of the metal plate 10 are in contact with each other with interposition of the heat dissipating grease 13, heat generated from the semiconductor element 3 and heat generated from the semiconductor element 4 can be effectively cooled.

In addition, according to the embodiment described above, at least a part of the side surface of the metal plate 10G is exposed from the molding resin 11. Then, the cooling pipe 17D is in contact with the side surface of the metal plate 10G exposed from the molding resin 11. According to the configuration, since the cooler 15D cools the heat generated from the semiconductor element 3 and the heat generated from the semiconductor element 4 through the inner side surface in contact with the side surface of the metal plate 10G of the resin package module 12G, the cooling efficiency is improved. In addition, according to the embodiment described above, the main terminal 6

(or the signal terminal 8) extends from the upper surface of the molding resin 11. According to the configuration, since the allowable range of the voltage applied to the semiconductor element 3 and the semiconductor element 4 is extended by increasing the insulation distance, the quality of the semiconductor device is improved.

In addition, according to the embodiment described above, the main terminal 6

(or the signal terminal 8) has a portion extending in a state of being flush with the upper surface on the upper surface of the molding resin 11. According to the configuration, since the allowable range of the voltage applied to the semiconductor element 3 and the semiconductor element 4 is extended by increasing the insulation distance, the quality of the semiconductor device is improved.

According to the embodiment described above, the main terminal 6 (or the signal terminal 8) has a portion extending in a state of being flush with the side surface of the molding resin 11 on the upper surface of the molding resin 11. According to the configuration, since the allowable range of the voltage applied to the semiconductor element 3 and the semiconductor element 4 is extended by increasing the insulation distance, the quality of the semiconductor device is improved.

In addition, according to the embodiment described above, the cooling pipe 17D is in contact with the side surface of the resin package module 12. According to the configuration, since the cooler 15D cools the heat generated from the semiconductor element 3 and the heat generated from the semiconductor element 4 through the inner side surface in contact with the resin package module 12, the cooling efficiency is improved.

In addition, according to the embodiment described above, the cooling pipe 17 is provided to surround the entire periphery of the resin package module 12 in a plan view. According to the configuration, the resin package module 12 can be effectively cooled.

In addition, according to the embodiment described above, the cooling pipe 17A is provided to surround only a part of the side surface of the resin package module 12 in a plan view. According to the configuration, since the cooling pipe 17A is disposed without surrounding the entire periphery of the resin package module 12 in a plan view, the occupied area (foot space) of the semiconductor device can be reduced.

In addition, according to the embodiment described above, the cooling pipe 17B has nipples at both ends in the longitudinal direction of the cooling pipe 17B. Here, the nipple corresponds to, for example, any one of the cooling water introduction nipple 18B, the cooling water drainage nipple 19B, and the like. According to the configuration, since the nipple is not provided in the linear portion of the cooling pipe 17B, it is possible to suppress the manufacturing cost or improve the assembling property.

In addition, according to the embodiment described above, the cooling pipe 17C is provided to surround only a pair of facing side surfaces of the resin package module 12 in a plan view. According to the configuration, since the cooling pipe 17C is disposed to surround only the pair of facing side surfaces without surrounding the entire periphery of the resin package module 12 in a plan view, an occupied area (foot space) of the semiconductor device can be reduced.

In addition, according to the embodiment described above, a wide band gap semiconductor is used for the semiconductor element 3. According to the configuration, the allowable range of the operating temperature of the semiconductor element is extended by using the wide band gap semiconductor. Therefore, allowance to heat generation imbalance in the semiconductor element and between the semiconductor elements is improved. Therefore, since the required cooling capacity of the cooler is lowered, the cooler can be made compact, and as a result, the size of the semiconductor device can be suppressed.

Modifications of Embodiments Described Above

In the embodiments described above, quality of material, material, dimensions, shape, relative arrangement relationship, or condition of implementation of each component may be described, but these are one example in all aspects, and the present invention is assumed not to be limited to those described in the embodiments.

Therefore, innumerable modifications not exemplified and their equivalents are assumed within the scope of the techniques disclosed in the specification of the present application. For example, a case of deforming, adding, or omitting at least one component, and furthermore, a case of extracting at least one component in at least one embodiment to combine the extracted component with a component in another embodiment are assumed to be included.

In addition, in the embodiments described above, when a material name or the like is described without being particularly designated, as long as no contradiction arises, the material is assumed to include a material that contains other additives, such as an alloy.

In addition, it is assumed that as long as no contradiction arises, the components described as being provided with "one" component in the embodiments described above may be provided with "one or more" components.

Furthermore, each component in the preferred embodiments described above is a conceptual unit, and the scope of the technology disclosed in the specification of the present application is assumed to include a case where one component includes a plurality of structures, a case where one component corresponds to part of a structure, and furthermore, a case where a plurality of components are included in one structure.

In addition, each component in the embodiments described above is assumed to include structures having other structures or shapes as long as the same function is exhibited.

In addition, the description in the specification of the present application is referred to for all purposes related to the present techniques, and none are assumed to be conventional techniques.

Explanation of Reference Signs 1, 1F, 1G, 1H, 1J: metal block
2, 5: brazing material
3, 4: semiconductor element
6: main terminal
7: wire bond
8: signal terminal
9: insulating material
10, 10G, 10H, 10J: metal plate
11: molding resin
12, 12F, 12G, 12H, 12J: resin package module
13: heat dissipating grease
14, 16: metal base
15, 15A, 15B, 15C, 15D, 15E, 15K: cooler
17, 17A, 17B, 17C, 17D, 17E: cooling pipe
18, 18B, 18C: cooling water introduction nipple
19, 19A, 19B, 19C: cooling water drainage nipple
20, 20A, 21, 21A: lead forming die
22: cooling water

The invention claimed is:

1. A semiconductor device comprising:
a semiconductor module; and
a cooler configured to cool the semiconductor module,
wherein the semiconductor module includes:
　a metal block,
　a semiconductor element provided on an upper surface of the metal block,
　a terminal connected to the semiconductor element, and
　a resin covering a part of the terminal, the metal block, and the semiconductor element,
wherein the cooler includes:
　a metal base provided in a region including the semiconductor module in a plan view while being in contact with a lower surface of the semiconductor module, and
　a cooling pipe disposed on an upper surface of the metal base, the cooling pipe being configured to circulate a refrigerant for cooling the semiconductor module, and
wherein the cooling pipe is provided to at least partially surround the semiconductor module in a plan view, the cooling pipe being provided on a lateral side surface of the semiconductor module, and wherein the terminal extends out of the lateral side surface of the semiconductor module and contacts and covers an upper surface of the cooling pipe.

2. The semiconductor device according to claim 1, wherein a lower surface of the metal block is covered with the resin, and wherein the metal base is in contact with a lower surface of the resin.

3. The semiconductor device according to claim 1, wherein the semiconductor module further includes:

an insulating material provided on a lower surface of the metal block, and a metal plate provided on a lower surface of the insulating material, wherein a lower surface of the metal plate is exposed from the resin, and wherein the metal base is in contact with a lower surface of the metal plate.

4. The semiconductor device according to claim 3, wherein at least a part of a side surface of the metal plate is exposed from the resin, and wherein the cooling pipe is in contact with a side surface of the metal plate exposed from the resin.

5. The semiconductor device according to claim 1, wherein the terminal extends from an upper surface of the resin.

6. The semiconductor device according to claim 5, wherein the terminal has a portion extending in a state of being flush with the upper surface of the resin on the upper surface of the resin.

7. The semiconductor device according to claim 5, wherein the terminal has a portion extending in a state of being flush with a side surface of the resin on an upper surface of the resin.

8. The semiconductor device according to claim 1, wherein the cooling pipe is in contact with the lateral side surface of the semiconductor module.

9. The semiconductor device according to claim 1, wherein the cooling pipe is provided to surround an entire periphery of the semiconductor module in a plan view.

10. The semiconductor device according to claim 1, wherein the cooling pipe is provided to surround only a part of a side surface of the semiconductor module in a plan view.

11. The semiconductor device according to claim 10, wherein the cooling pipe has nipples at both ends in a longitudinal direction of the cooling pipe.

12. The semiconductor device according to claim 1, wherein the cooling pipe is provided to surround only a pair of facing side surfaces of the semiconductor module in a plan view.

13. The semiconductor device according to claim 1, wherein a wide band gap semiconductor is used for the semiconductor element.

14. The semiconductor device according to claim 1, wherein the cooling pipe is provided above the lower surface of the semiconductor module.

15. The semiconductor device according to claim 1, wherein the cooler further includes:

an introduction nipple configured to introduce the refrigerant to the semiconductor module in a first direction, and a drainage nipple configured to discharge the refrigerant from the semiconductor device in the first direction, wherein the refrigerant is configured to pass the semiconductor module to cool the semiconductor module within the cooling pipe at a position outside of the semiconductor module in a second direction perpendicular to the first direction in plan view.

16. The semiconductor device according to claim 2, wherein a portion of the resin is directly below the lower surface of the metal block.

17. The semiconductor device according to claim 1, wherein the cooling pipe is configured to laterally circulate the refrigerant for cooling the semiconductor module.

18. The semiconductor device according to claim 1, wherein a height of the cooling pipe is smaller than a height of the semiconductor module in cross-sectional view.

19. The semiconductor device according to claim 1, wherein the terminal extends out of the lateral side surface of the semiconductor module at a position above the cooling pipe.

20. The semiconductor device according to claim 18, wherein the terminal extends out of the lateral side surface of the semiconductor module at a position above the cooling pipe.

*  *  *  *  *